(12) United States Patent
Lee et al.

(10) Patent No.: US 7,855,912 B2
(45) Date of Patent: *Dec. 21, 2010

(54) CIRCUIT AND METHOD FOR MULTIPLE-LEVEL PROGRAMMING, READING, AND ERASING DUAL-SIDED NONVOLATILE MEMORY CELL

(75) Inventors: Peter Lee, Saratoga, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 120 days.

This patent is subject to a terminal disclaimer.

(21) Appl. No.: 12/069,637

(22) Filed: Feb. 12, 2008

(65) Prior Publication Data

US 2008/0205141 A1    Aug. 28, 2008

Related U.S. Application Data

(60) Provisional application No. 60/903,731, filed on Feb. 26, 2007, provisional application No. 60/904,294, filed on Feb. 28, 2007, provisional application No. 60/918,116, filed on Mar. 14, 2007.

(51) Int. Cl.
*G11C 11/34* (2006.01)

(52) U.S. Cl. .................. 365/185.03; 365/185.18; 365/185.28

(58) Field of Classification Search ............. 365/185.03, 365/185.18, 185.28, 185.2, 185.29, 185.24, 365/185.25, 185.26

See application file for complete search history.

(56) References Cited

U.S. PATENT DOCUMENTS 5,768,192 A   6/1998   Eitan

| 6,163,048 A | 12/2000 | Hirose et al. |
|---|---|---|
| 6,490,204 B2 | 12/2002 | Bloom et al. |
| 6,614,070 B1 | 9/2003 | Hirose et al. |

(Continued)

OTHER PUBLICATIONS

Co-pending U.S. Appl. No. 12/069,228, filed Feb. 8, 2008, "A Bit Line Structure for a Multilevel, Dual-Sided Nonvolatile Memory Cell Array," assigned to the same assingee as the present invention.

(Continued)

*Primary Examiner*—Dang T Nguyen
(74) *Attorney, Agent, or Firm*—Saile Ackerman LLC; Stephen B. Ackerman; Billy Knowles

(57) ABSTRACT

A control apparatus programs, reads, and erases trapped charges representing multiple data bits from a charge trapping region of a NMOS dual-sided charge-trapping nonvolatile memory cell includes a programming circuit, an erasing circuit, and a reading circuit. The programming circuit provides a negative medium large program voltage to cell's gate along with positive drain and source voltage to inject hot carriers of holes to two charge trapping regions, one of a plurality of threshold adjustment voltages representing a portion of the multiple data bits to the drain and source regions to set the hot carrier charge levels to the two charge trapping regions. The erasing circuit provides a very large positive erase voltage to tunnel the electrons from cell's channel to whole trapping layer including the two charge trapping regions. The reading circuit generates one of a plurality of threshold detection voltages to detect one of a plurality of programmed threshold voltages representative of multiple data bits, generates a drain voltage level to activate the charge-trapping nonvolatile memory cell.

51 Claims, 17 Drawing Sheets

U.S. PATENT DOCUMENTS

| | | | |
|---|---|---|---|
| 6,614,692 | B2 | 9/2003 | Eliyahu et al. |
| 6,934,190 | B1* | 8/2005 | Liu et al. ............... 365/185.19 |
| 6,937,521 | B2 | 8/2005 | Avni et al. |
| 7,113,431 | B1 | 9/2006 | Hamilton et al. |
| 7,116,577 | B2 | 10/2006 | Eitan |
| 7,120,063 | B1 | 10/2006 | Liu et al. |
| 7,123,532 | B2 | 10/2006 | Lusky et al. |
| 7,136,304 | B2 | 11/2006 | Cohen et al. |
| 7,151,293 | B1 | 12/2006 | Shiraiwa et al. |
| 7,158,411 | B2 | 1/2007 | Yeh et al. |
| 7,170,785 | B2 | 1/2007 | Yeh |
| 7,187,030 | B2 | 3/2007 | Chae et al. |
| 7,203,092 | B2 | 4/2007 | Nazarian |
| 2006/0146603 | A1* | 7/2006 | Kuo et al. ................... 365/177 |
| 2008/0084764 | A1* | 4/2008 | Pikhay et al. .......... 365/185.29 |

OTHER PUBLICATIONS

Co-pending U.S. Appl. No. 12/075,677, filed Mar. 13, 2008, "A Bit Line Gate Transistor Structure for a Multilevel, Dual-Sided Nonvolatile Memory Cell NAND Flash Array," assigned to the same assignee as the present invention.

"A 146-mm squared 8-Gb Multi-Level NAND Flash Memory with 70-nm CMOS Technology," by Hara et al., IEEE Journal of solid-State Circuits, vol. 41, No. 1, Jan. 2006, pp. 161-169.

"NROM: A Novel Localized Trapping, 2-Bit Nonvolatile Memory Cell," by Eitan et al., IEEE Electron Device Letters, vol. 21, No. 11, Nov. 2000, pp. 543-545.

"A Dual-Mode NAND Flash Memory:1-Gb Multilevel and High-Performance 512-Mb Single-Level Modes," IEEE Jrnl of Solid-State Cir., vol. 36, No. 11, Nov. 2001, pp. 1700-1705.

"Intel StrataFlashTM Memory Technology Overview," by Atwood et al., Intel Technology Journal Q497, 1997, pp. 1-8.

* cited by examiner

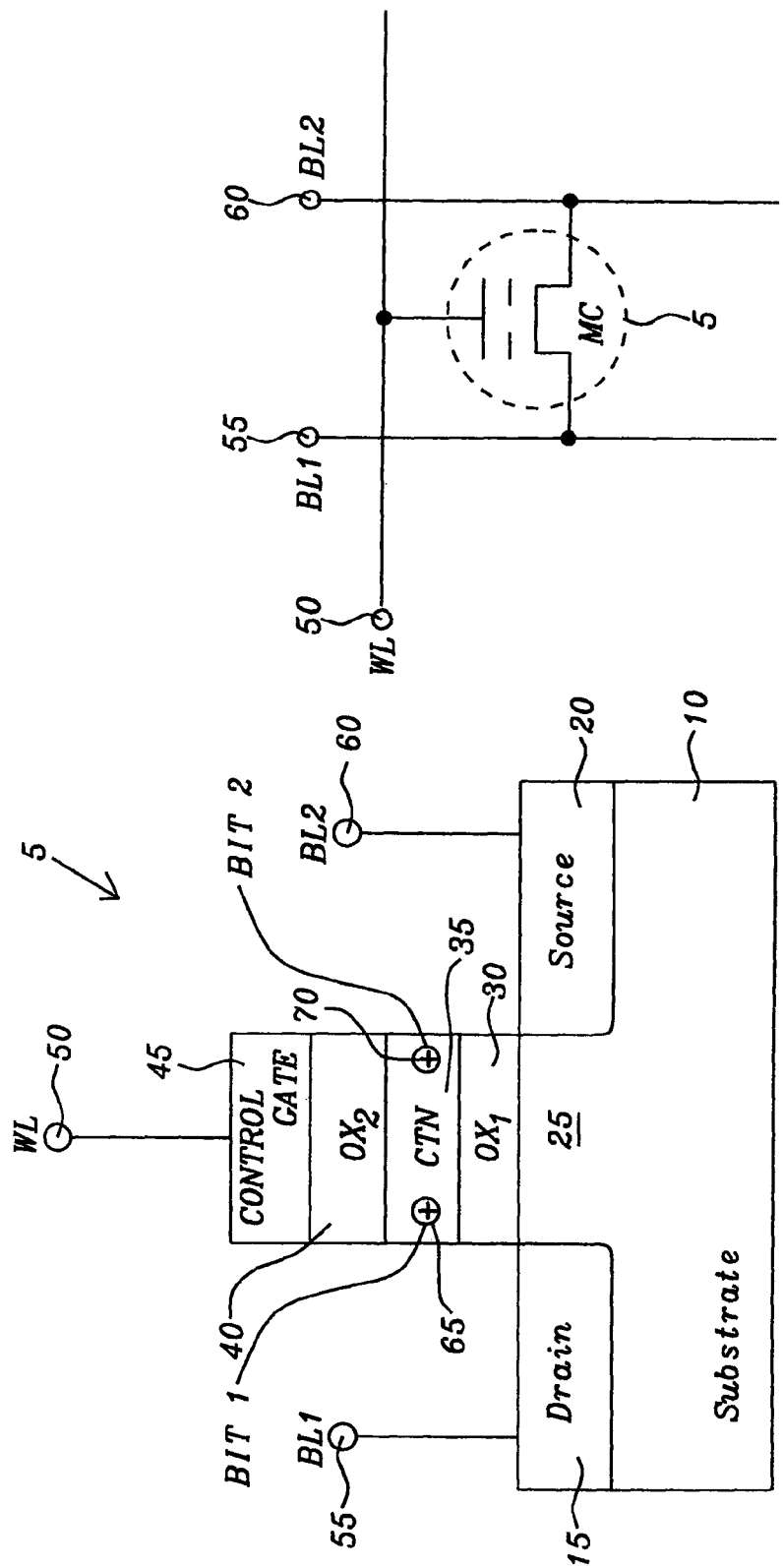

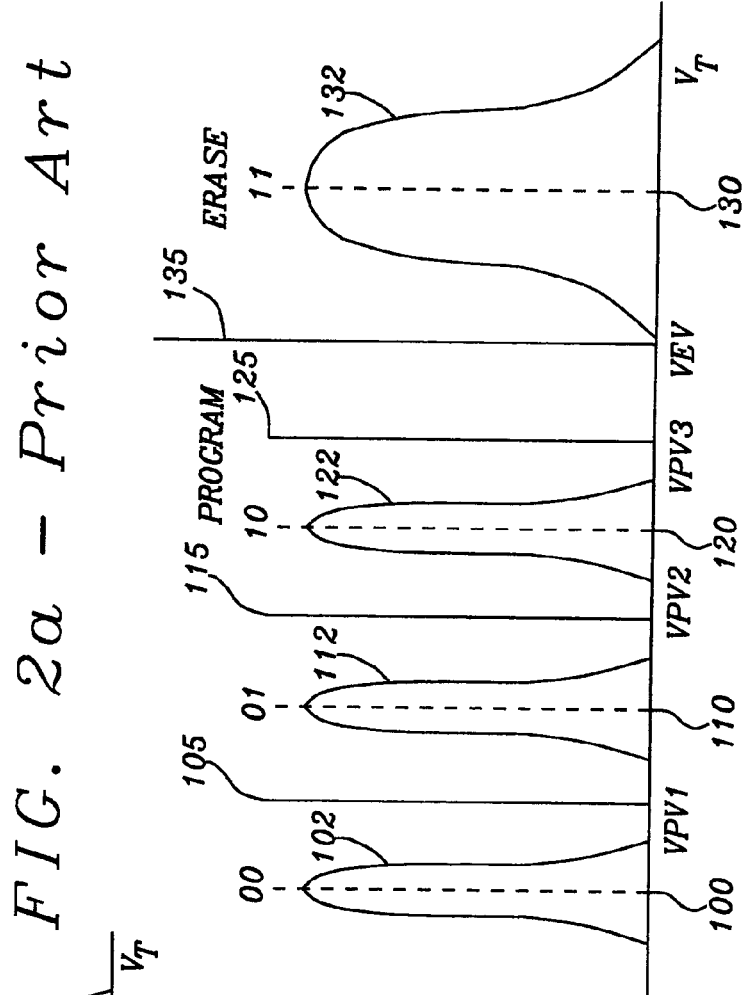
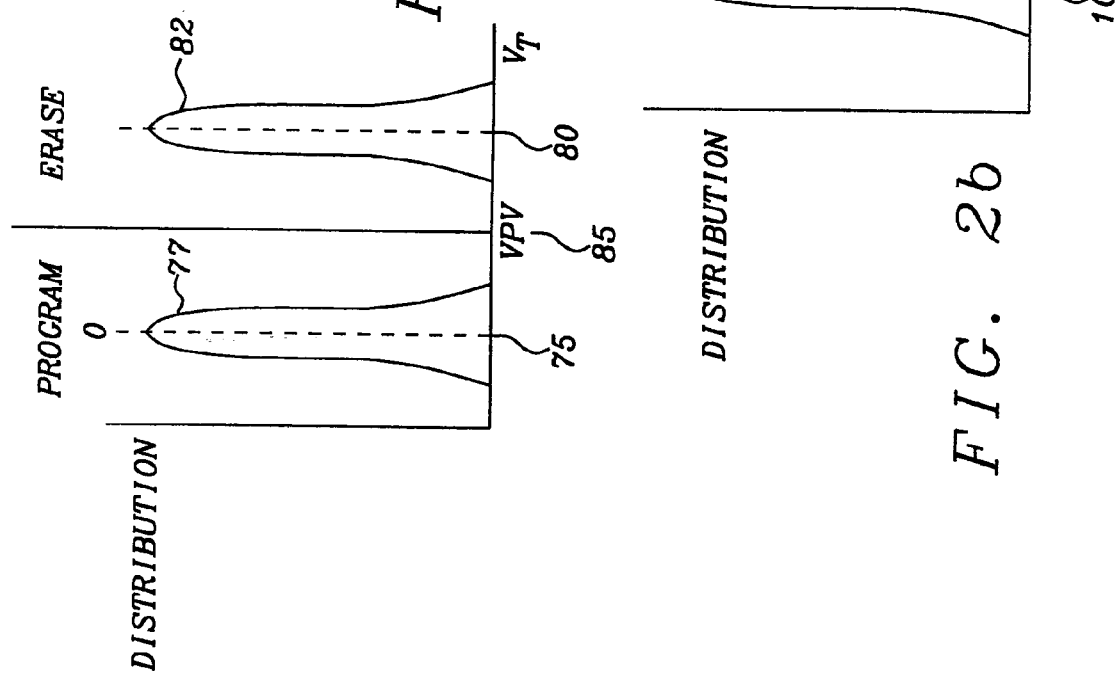
FIG. 2a – Prior Art
FIG. 2b

PROGRAM

| GENERATOR | VOLTAGE BIT 1 | VOLTAGE BIT 2 |
|---|---|---|
| 485 ~ VWL | $V_{PGM}$ | $V_{PGM}$ |
| 475 ~ VBL1 | $V_{BLn}$ | $V_{BLn}$ |
| 480 ~ VBL2 | $V_{BLn}$ | $V_{BLn}$ |

FIG. 6a

ERASE

| GENERATOR | VOLTAGE BIT 1 | VOLTAGE BIT 2 |
|---|---|---|
| 485 ~ VWL | $V_{ERS}$ | $V_{ERS}$ |
| 475 ~ VBL1 | $0/V_{INH}$ | $0/V_{INH}$ |
| 480 ~ VBL2 | $0/V_{INH}$ | $0/V_{INH}$ |

FIG. 6b

READ

| GENERATOR | VOLTAGE BIT 1 | VOLTAGE BIT 2 |
|---|---|---|
| 485 ~ VWL | $V_{READ}$ | $V_{READ}$ |
| 475 ~ VBL1 | 0 | $V_{DRAIN}$ |
| 480 ~ VBL2 | $V_{DRAIN}$ | 0 |

FIG. 6c

SIMULTANEOUS PROGRAM

| GENERATOR | VOLTAGE BIT 1 | VOLTAGE BIT 2 |
|---|---|---|
| $VWL[0]$ | $V_{PGM}$ | $V_{PGM}$ |
| $VWL[m]$ | $0V$ | $0V$ |
| $VBL1$ | $V_{BLn}$ | $V_{BLn}$ |
| $VBL2$ | $V_{BLn}$ | $V_{BLn}$ |
| $VBLn-1$ | $V_{BLn}$ | $V_{BLn}$ |
| $VBLn$ | $V_{BLn}$ | $V_{BLn}$ |

FIG. 8a

SEQUENTIAL PROGRAM

| GENERATOR | VOLTAGE BIT 1 | VOLTAGE BIT 2 |
|---|---|---|
| $VWL[0]$ | $V_{PGM}$ | $V_{PGM}$ |
| $VWL[m]$ | $0V$ | $0V$ |
| $VBL1$ | $V_{BLn}$ | $0$ |
| $VBL0$ | $0$ | $V_{BLn}$ |
| $VBLn-1$ | $V_{BLn}$ | $0$ |

FIG. 8b

ERASE

| GENERATOR | VOLTAGE BIT 1 | VOLTAGE BIT 2 |
|---|---|---|
| VWL[0] | $V_{ERS}$ | $V_{ERS}$ |
| VWL[m] | 0V | 0V |
| VBL1 | $0/V_{INH}$ | $0/V_{INH}$ |
| VBL0 | $0/V_{INH}$ | $0/V_{INH}$ |
| VBLn-1 | $0/V_{INH}$ | $0/V_{INH}$ |
| VBLn | $0/V_{INH}$ | $0/V_{INH}$ |

FIG. 8c

READ

| GENERATOR | VOLTAGE BIT 1 | VOLTAGE BIT 2 |
|---|---|---|
| VWL[0] | $V_{READ}$ | $V_{READ}$ |
| VWL[m] | $V_{PASS}$ | $V_{PASS}$ |
| VBL1 | $V_{DRAIN}$ | 0 |
| VBL0 | 0 | $V_{DRAIN}$ |
| VBLn-1 | $V_{DRAIN}$ | 0 |
| VBLn | 0 | $V_{DRAIN}$ |

FIG. 8d

CIRCUIT AND METHOD FOR MULTIPLE-LEVEL PROGRAMMING, READING, AND ERASING DUAL-SIDED NONVOLATILE MEMORY CELL

This application claims priority under 35 U.S.C. §119 to U.S. Provisional Patent Application Ser. No. 60/903,731, filed on Feb. 26, 2007, which is herein incorporated by reference in its entirety.

This application claims priority under 35 U.S.C. §119 to U.S. Provisional Patent Application Ser. No. 60/904,294, filed on Feb. 28, 2007, which is herein incorporated by reference in its entirety.

This application claims priority under 35 U.S.C. §119 to U.S. Provisional Patent Application Ser. No. 60/918,116, filed on Mar. 14, 2007, which is herein incorporated by reference in its entirety.

RELATED PATENT APPLICATIONS

U.S. patent application Ser. No. 12/069,228 filed on Feb. 8, 2008, assigned to the same assignee as the present invention, and incorporated herein by reference in its entirety.

U.S. patent application Ser. No. 12/075,677 filed on Mar. 13, 2008, assigned to the same assignee as the present invention, and incorporated herein by reference in its entirety.

BACKGROUND OF THE INVENTION

1. Field of the Invention

This invention relates generally to nonvolatile memory operation. More particularly, this invention relates to operation of dual-sided charge-trapping nonvolatile memory cells. Even more particularly, this invention relates to circuits and methods for operation of dual-sided charge-trapping nonvolatile memory cell for programming, reading, and erasing trapped charges representing multiple digital data bits within a charge trapping region of the dual-sided charge-trapping nonvolatile memory cells.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular type of Nonvolatile Memory. Flash Memory has the combined advantages of the high density, small silicon area, low cost and can be repeatedly programmed and erased with a single low-voltage power supply voltage source.

The Flash Memory structures known in the art employ a charge storage mechanism and a charge trapping mechanism. The charge storage regime, as with a floating gate nonvolatile memory, the charge representing digital data is stored on a floating gate of the device. The stored charge modifies the threshold voltage of the floating gate memory cell determine that digital data stored. In a charge trapping regime, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$). The trapping structure of the charge trapping layer is such that it is possible to store two bits of data in a single SONOS/MONOS nonvolatile memory cell.

U.S. Pat. No. 5,768,192 (Eitan) illustrates a charge trapping non-volatile semiconductor memory cell utilizing asymmetrical charge trapping. The programmable read only memory (PROM) has a trapping dielectric sandwiched between two silicon dioxide layers The trapping dielectric are silicon oxide-silicon nitride-silicon oxide (ONO) and silicon dioxide with buried polysilicon islands. A nonconducting dielectric layer functions as an electrical charge trapping medium. This charge trapping layer is sandwiched between two layers of silicon dioxide acting as an electrical insulator. A conducting control gate layer is placed over the upper silicon dioxide layer. The memory device is programmed using hot electron programming, by applying programming voltages to the gate and the drain while the source is grounded. Hot electrons are accelerated sufficiently to be injected into the region of the trapping dielectric layer near the drain. The device is read in the opposite direction from which it was written. The reading voltages are applied to the gate and the source while the drain is grounded. For the same applied gate voltage, reading in the reverse direction greatly reduces the potential across the trapped charge region. This permits much shorter programming times by amplifying the effect of the charge trapped in the localized trapping region.

U.S. Pat. No. 7,187,030 (Chae, et al.) describes a SONOS memory device, and a method for erasing data from the SONOS memory device. The erasing includes injecting charge carriers of a second sign into a trapping film, which has trapped charge carriers of a first sign to store data in the trapping film. The charge carriers of the second sign are generated by an electric field formed between one of a first and second electrodes contacting at least one bit line and a gate electrode contacting a word line. A blocking film may be provided between the gate electrode and the trapping film. The charge carriers of the second sign may be hot holes.

U.S. Pat. No. 7,170,785 (Yeh) illustrates a method and apparatus for operating a string of charge trapping memory cells. The string of memory cells with a charge trapping structure is read, by selecting part of a memory cell selected by a word line. Part of the memory cell is selected by turning on one of the pass transistors on either side of the string of memory cells. The charge storage state of the selected part is determined by measuring current in a bit line tied to both pass transistors.

U.S. Pat. No. 7,158,411 (Yeh, et al.) provides a memory architecture for an integrated circuit that includes a first memory array configured to store data for one pattern of data usage and a second memory array configured to store data for another pattern of data usage. The first and second memory arrays are formed of charge storage based nonvolatile memory cells.

U.S. Pat. No. 7,151,293 (Shiraiwa, et al.) describes SONOS memory with inversion bit-lines. The SONOS memory cell, formed within a semiconductor substrate, includes a bottom dielectric disposed on the semiconductor substrate, a charge trapping material disposed on the bottom dielectric, and a top dielectric disposed on the charge trapping material. Furthermore, the SONOS memory cell includes a word-line gate structure disposed on the top dielectric and at least one bit-line gate for inducing at least one inversion bit-line within the semiconductor substrate.

U.S. Pat. No. 7,120,063 (Liu, et al.) illustrates flash memory cells that include a dielectric material formed above a substrate channel region, a charge trapping material formed over the dielectric material, and a control gate formed over the charge trapping material. The cell may be programmed by directing electrons from the control gate into the charge trapping material to raise the cell threshold voltage. The electrons may be directed from the control gate to the charge trapping material by coupling a substrate to a substrate voltage potential, and coupling the control gate to a gate voltage potential, where the gate voltage potential is lower than the substrate voltage potential. The cell may be erased by directing electrons from the charge trapping material into the control gate to lower a threshold voltage of the flash memory cell, such as by coupling the substrate to a substrate voltage potential, and coupling the control gate to a gate voltage potential, where the gate voltage potential is higher than the substrate voltage potential.

The nonvolatile memory cells of the prior art are often configured as NAND cell structures. U.S. Pat. No. 6,614,070 and U.S. Pat. No. 6,163,048 (Hirose, et al.) describe a semiconductor nonvolatile memory device having a NAND cell structure. A NAND stack of nonvolatile memory cell transistors is placed within a well formed on a semiconductor substrate. The series nonvolatile memory cell transistors have threshold voltages that are electrically altered over a range of depletion values. When a cell within a certain NAND stack is selected for a read operation, a peripheral circuit drives selected gate word line to the well potential and drives the word lines of the other gates within the selected NAND stack to a potential at least equal in magnitude to the magnitude of the a reference voltage plus the threshold voltage of a memory cell in the programmed state.

"A 146-mm² 8-Gb Multi-Level NAND Flash Memory with 70-nm CMOS Technology", Hara, et al., IEEE Journal of Solid-State Circuits, January 2006, Vol.: 41, Issue: 1, pp.: 161-169 provides an 8-Gb multi-level NAND Flash memory with 4-level programmed cells.

"NROM: A Novel Localized Trapping, 2-Bit Nonvolatile Memory Cell", Eitan, et al., IEEE Electron Device Letters, November, 2000, Vol.: 21, Issue: 11, pp.: 543-545, presents a novel flash memory cell based on localized charge trapping in a dielectric layer. It is based on the storage of a nominal ~400 electrons above a n+/p junction. Programming is performed by channel hot electron injection and erase by tunneling enhanced hot hole injection. The read methodology is sensitive to the location of trapped charge above the source. This single device cell has a two physical bit storage capability.

"A Dual-Mode NAND Flash Memory: 1-Gb Multilevel and High-Performance 512-Mb Single-Level Modes", Cho et al. IEEE Journal of Solid-State Circuits, November, 2001, Vol.: 36, Issue: 11, pp.: 1700-1706, describes a 116.7-mm² NAND flash memory having two modes: a 1-Gb multilevel program mode (MLC) and a high-performance 512-Mb single-level program cell (SLC) modes. A two-step bit line setup scheme suppresses the peak current below 60 mA. A word line ramping technique avoids program disturbance. The SLC mode uses the 0.5-V incremental step pulse and self-boosting program inhibit scheme to achieve high program performance, and the MLC mode uses 0.15-V incremental step pulse and local self-boosting program inhibit scheme to tightly control the cell threshold voltage Vth distributions.

The structure of a multiple bit programming of nonvolatile memory cells is known in the art as described in "Intel StrataFlash™ Memory Technology Overview", Atwood, et al., Intel Technology Journal, Vol. 1, Issue 2, Q4 1997, found www.intel.com, Apr. 23, 2007. The nonvolatile memory cells include a single transistor with an isolated floating gate. The flash cell is an analog storage device in that it stores charge (quantized at a single electron) not bits. By using a controlled programming technique, it is possible to place a precise amount of charge on the floating gate. The charge can be accurately placed to one of four charge states (or ranges) that describe two bits. Each of the four charge states is associated with a two-bit data pattern. The number of states required is equal to 2N where N is the desired number of bits. Threshold of the flash cells is then determined to read the digital data stored in the flash cell.

U.S. Pat. No. 7,113,431 (Hamilton, et al.) pertains to a technique for erasing bits in a dual bit memory in a manner that maintains complementary bit disturb control of bit-pairs of memory cells wherein each bit of the dual bit memory cell can be programmed to multiple levels. One exemplary method comprises providing a word of memory cells after an initial erasure and programming of the bits of the word to one or more of the higher program levels. A disturb level is determined for each of the bit-pairs of the word. A combined disturb level is then computed that is representative of the individual disturb levels. A pattern of drain voltages is then applied to the word for a number of program passes until a target pattern is stored in the word of memory cells based on the combined disturb level and the unprogrammed bit of the bit-pairs is erased to a single program level. This compensates for the disturbance level that exists between the complementary bit-pairs of the word, improves the threshold voltage (Vt) distribution at the program level of the erased state and thereby improves the accuracy of subsequent higher level programming operations and mitigates false or erroneous reads of the states of such program levels.

SUMMARY OF THE INVENTION

An object of this invention is to provide a control apparatus for operation of a dual-sided charge-trapping nonvolatile memory cell for programming, reading, and erasing trapped charges representing multiple digital data bits within a charge trapping region of the dual-sided charge-trapping nonvolatile memory cell.

To accomplish at least this object, a control apparatus for operation of a dual-sided charge-trapping nonvolatile memory cell includes a programming circuit, a reading circuit, and an erasing circuit. The programming circuit has a word line program voltage source that provides a very large program voltage for generating a voltage field between a control gate of the dual-sided charge-trapping nonvolatile memory cell and a channel region of the dual-sided charge-trapping nonvolatile memory cell to extract hot carriers from the channel region to be injected into a charge trapping region of the dual-sided charge-trapping nonvolatile memory cell. A first bit line program voltage source provides one of a plurality of threshold adjustment voltages representing a portion of the multiple digital data bits to a first drain/source of the nonvolatile memory cell array to set a first level of the hot carrier charge representing the portion of the multiple digital data bits to charge trapping region. A second bit line program voltage source that provides a second of the plurality of threshold adjustment voltages representing another portion of the multiple digital data bits to a second drain/source of the nonvolatile memory cell array to set a second level of the hot carrier charge representing the portion of the multiple digital data bits to charge trapping region.

In sequential programming of the first and second charge trapping regions, the first bit line program voltage source provides one threshold adjustment voltage to the first drain/source of the nonvolatile memory cell array and the second bit line program voltage source to a ground reference voltage level to program the first drain/source to inject charge to the first charge trapping region. Subsequent to injecting charge to the first charge trapping region, the second bit line program voltage source provides the second of the plurality of threshold adjustment voltages to the second drain/source of the nonvolatile memory cell array and the first bit line program voltage source to a ground reference voltage level to program the first drain/source to inject charge to the second charge trapping region. The order of the injecting the charge to the first and second charge trapping regions maybe reversed and the second bit line program voltage source provides the second of the plurality of threshold adjustment voltages to the second drain/source of the nonvolatile memory cell array and the first bit line program voltage source to a ground reference voltage level to program the first drain/source to inject charge to the second charge trapping region prior to injecting charge to the first charge trapping region.

In simultaneous programming of the first and second charge trapping regions, the first bit line program voltage source provides the one of the plurality of threshold adjustment voltages to the first drain/source of the nonvolatile memory cell array and the second bit line program voltage source simultaneously provides the second of the plurality of threshold adjustment voltages to the second drain/source of the nonvolatile memory cell array to concurrently inject charge to the first charge trapping region and the second charge trapping region.

The reading circuit includes a word line read voltage source that generates sequentially each one of a plurality of threshold detection voltages to detect one of a plurality of programmed threshold voltages of the dual-sided charge-trapping nonvolatile memory cell resulting from a selected one of the plurality of threshold adjustment voltages representative of the portion of multiple digital data bits. A read drain voltage generator generates a drain voltage level that is transferred to first drain/source and the second drain/source to activate the dual-sided charge-trapping nonvolatile memory cell dependent upon a trapped charge level within the charge trapping region. A first ground reference voltage generator generates a ground reference voltage transferred to the first and second drain/sources. A sensing circuit detects a programmed state of the charge trapping region representing the multiple digital data bits.

The erasing apparatus extracts the hot carrier charges from the charge trapping region has a word line erase voltage source. The word line erase voltage source provides a very large erase voltage for generating a voltage field between the channel region of the dual-sided charge-trapping nonvolatile memory cell and the control gate of the dual-sided charge-trapping nonvolatile memory cell to extract hot carriers from the charge trapping region to be injected into channel region of the dual-sided charge-trapping nonvolatile memory cell. A second ground reference voltage generator applies the ground reference voltage to the first and second drain/sources.

If the dual-sided charge-trapping nonvolatile memory cell is an n-channel memory cell, the very large negative program voltage has a level of from approximately −6.0V to approximately −10.0V along with positive drain/source voltage to cause the hot carrier injection to be a hot hole injection to the charge trapping layer. (The plurality of threshold adjustment voltages have a voltage range of from approximately +0.5V to approximately +6.0V divided into intervals sufficient to determine the first and second portion of the plurality of the multiple digital data bits.) (Is this sentence a duplicate of the following sentence?) The plurality of threshold detection voltages have a voltage range from approximately 0.5V to approximately 6.0V and are divided into increments that differentiate the plurality of programmed threshold voltages. The drain voltage level in read operation must be a voltage level sufficient to overcome threshold voltages of the first and second drain sources and not sufficient to cause soft writing of the dual-sided charge-trapping nonvolatile memory cell. The very large erase voltage has voltage level of from approximately +15.0V to approximately +20V to increase the threshold voltage of the dual-sided charge-trapping nonvolatile memory cell.

If the dual-sided charge-trapping nonvolatile memory cell is an p-channel memory cell, the very large positive program voltage has a level of from approximately +6.0V to approximately +10.0V to cause the hot carrier injection to be a hot electron injection to the charge trapping layer. The plurality of threshold adjustment voltages have a voltage range of from approximately −1.0V to approximately −6.0V divided into intervals sufficient to determine the first and second portion of the plurality of the multiple digital data bits (Is this the duplicate sentence of the following sentence?). The plurality of threshold detection voltages have a voltage range from approximately −2.0V to approximately −5.0V and are divided into increments that differentiate the plurality of programmed threshold voltages. The drain voltage level must be a voltage level sufficient to overcome threshold voltages of the first and second drain sources and not sufficient to cause soft writing of the dual-sided charge-trapping nonvolatile memory cell. The very large erase voltage has voltage level of from approximately −15.0V to approximately −20V to decrease the threshold voltage of the dual-sided charge-trapping nonvolatile memory cell.

BRIEF DESCRIPTION OF THE DRAWINGS

FIGS. 1a and 1b are respectively a schematic symbol for and a cross sectional view of a dual-sided charge-trapping nonvolatile memory cell.

FIG. 2a is a plot of the threshold voltage ($V_t$) for programming each memory cell of an array of dual-sided charge-trapping nonvolatile memory cells versus the number of dual-sided charge-trapping nonvolatile memory cells having a specific threshold voltage for a single bit programming of the prior art.

FIGS. 2b and 2c are plots of four or eight threshold voltage ($V_t$) for programming each NMOS memory cell of an array of dual-sided charge-trapping nonvolatile memory cells versus the number of dual-sided charge-trapping nonvolatile memory cells having a specific threshold voltage for a multiple bit programming by a programming circuit of the control apparatus of this invention.

FIGS. 6a, 6b, 6c, and 6d are tables of the voltages respectively generated by the programming circuit for sequential and simultaneous programming, the erasing circuit, and the reading circuit of the control apparatus of this invention for programming, erasing, and reading a single cell of NMOS dual-sided charge-trapping nonvolatile memory cells.

FIGS. 8a, 8b, 8c, and 8d are tables of the voltages respectively generated by the programming circuit for sequential and simultaneous programming, the erasing circuit, and the reading circuit of the control apparatus of this invention for programming, erasing, and reading an array of NMOS dual-sided charge-trapping nonvolatile memory cells.

DETAILED DESCRIPTION OF THE INVENTION

Figure 2C:
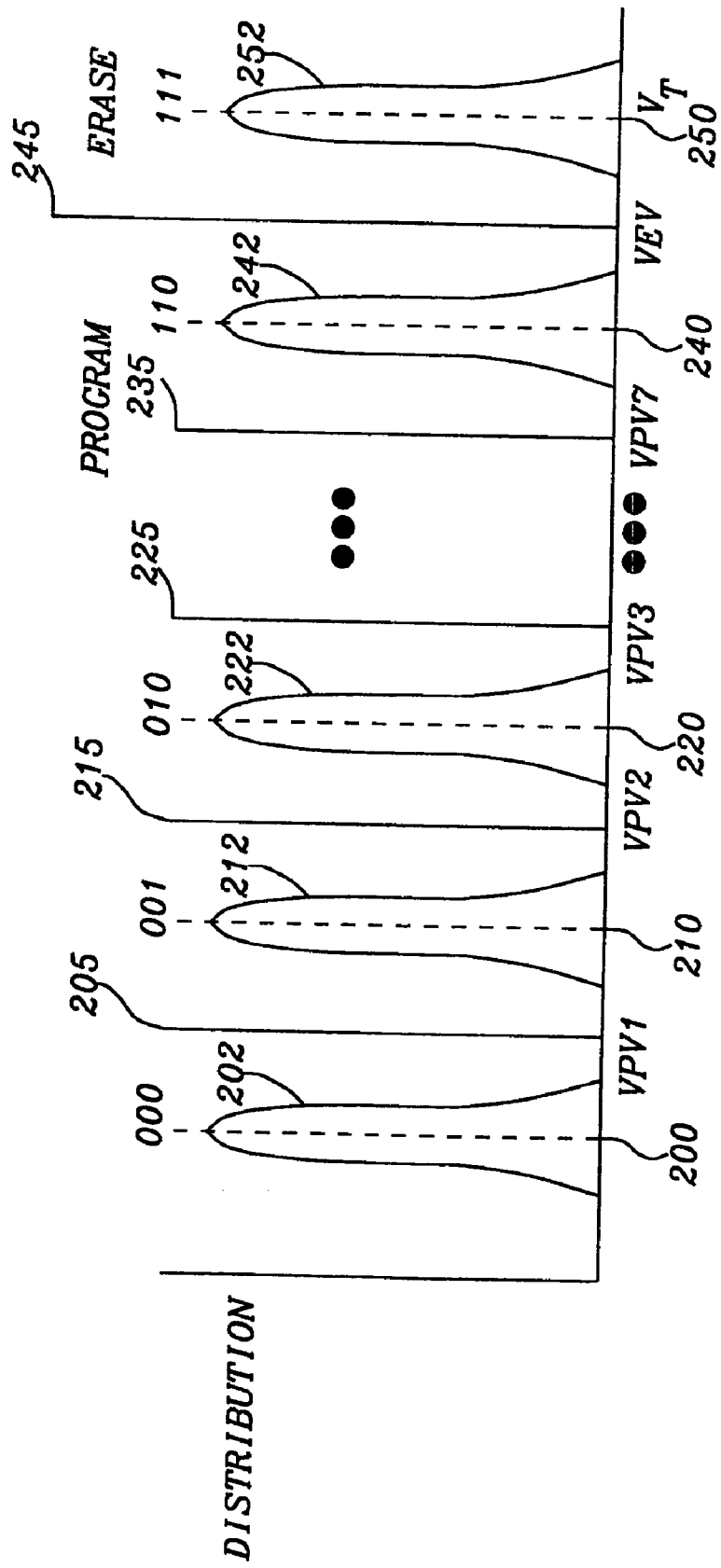

Refer now to FIGS. 1a and 1b for a discussion Silicon-Oxide-Nitride-Oxide-Silicon (SONOS) or Metal-Oxide-Nitride-Oxide-Silicon (MONOS) dual-sided flash memory cell structure in FIG. 1a and the schematic symbol in FIG. 1b. The dual-sided charge-trapping nonvolatile memory cell 5 is formed within a substrate 10. A drain region 15 and source region 20 are formed within the substrate 10. A relatively thin gate oxide or tunneling oxide 30 is deposited on the substrate 10. A charge trapping layer 35 is then formed over the oxide layer 30 above the channel region 25 between drain region 15 and source region 20. A second dielectric oxide layer 40 is placed on top of charge trapping layer 35 to separate charge trapping layer 35 from a conductive layer 45 such as poly-crystalline silicon or metal (aluminum or copper). The conductive layer 45 forms the control gate of the dual-sided charge-trapping nonvolatile memory cell 5. The control gate 45 of the dual-sided charge-trapping nonvolatile memory cell 5, when placed in an NOR array of dual-sided charge-trapping nonvolatile memory cells 5, is connected to a word line terminal 50. The drain 15 is connected to a first bit line terminal 55 and the source 20 is connected to a second bit line terminal 55. The dual-sided flash memory cell stores the digital data bits as trapped charge within the charge trapping layer 35 above the channel 25 that is formed between drain 15 and source 20.

The operation of the SONOS/MONOS dual-sided NMOS flash memory cell 5 consists of an erase operation, a program operation, and a read operation. In the erase operation, the word line terminal 50 is set to a very large positive erasing voltage that is applied to the control gate 45 to inject electrons into the trapping region 35 from channel region 35. The first and second bit line terminals 55 and 60 and thus the drain 15 and source 20 are set to ground reference level. The program operation of the SONOS/MONOS dual-sided flash memory cell 5 begins by setting the word line terminal 50 to a very medium large negative programming voltage that is applied to the control gate 45. The medium large programming voltage has an opposite polarity of the very large erasing voltage. For programming the charge trapping region 65 nearest the drain region 15, the first bit line terminal 55 and thus the drain 15 is set to the bit line voltage level and the second bit line terminal 60 and thus the source 20 is set to the ground or floating reference voltage. For programming the charge trapping region 70 nearest the source region 20, the second bit line terminal 60 and thus the source 20 is set to the bit line voltage level and the first bit line terminal 55 and thus the drain 15 is set to the ground or floating reference voltage. The read operation begins by setting the word line terminal 50 and thus the control gate 45 to a read voltage level. To read the program state of the charge trapping region 65, the first bit line terminal 55 and thus the drain region 15 is set to the ground reference voltage and the second bit line terminal 60 and thus the source region 20 is set to the drain read voltage level. The threshold voltage ($V_t$) as adjusted by the charge level of the charge trapping region 65 determines the digital data stored in the charge trapping region 65. To read the program state of the charge trapping region 70, the first bit line terminal 55 and thus the drain region 15 is set to the drain read voltage level and the second bit line terminal 60 and thus the source region 20 is set to the ground reference voltage. The threshold voltage ($V_t$) as adjusted by the charge level of the charge trapping region 70 determines the digital data stored in the charge trapping region 70.

In the prior art, as illustrated in the FIG. 2a, a SONOS/MONOS dual-sided flash memory cell structure has one bit of data stored in each of the charge trapping regions 65 and 70. The digital data is stored such that a zero (0) is represented by a shift of the threshold voltage ($V_t$) of the SONOS/MONOS dual-sided flash memory cell to a more negative level 75. A one (1) level is represented by a shift of the threshold voltage ($V_t$) of the SONOS/MONOS dual-sided flash memory cell to a more positive level 80. In an array of the of the SONOS/MONOS dual-sided flash memory cells, the distribution 77 of the of the SONOS/MONOS dual-sided flash memory cells for the threshold voltages representing the zero (0) level and the distribution 82 of the of the SONOS/MONOS dual-sided flash memory cells for the threshold voltages representing the one (1) level determine the programmed voltage level (VPV) 85. The programmed voltage level (VPV) 85 is applied to the control gate of the SONOS/MONOS dual-sided flash memory cell through the word line. During a read operation the control gate is set to the programmed voltage level (VPV) 85, if the SONOS/MONOS dual-sided flash memory cell is programmed with the zero (0), the SONOS/MONOS dual-sided flash memory cell will be turned on. If the SONOS/MONOS dual-sided flash memory cell is programmed with the one (1), the SONOS/MONOS dual-sided flash memory cell will not be turned off.

The method of operation of this invention for a SONOS/MONOS dual-sided flash memory cell provides multiple bits being stored in each of the charge trapping regions 65 and 70 of FIG. 1a. The level of charge in each charge trapping region is adjusted such that threshold voltage level ($V_t$) assumes one of a group of threshold levels based on the charge placed in the charge trapping regions. In FIG. 2b, each of the charge trapping regions may have one of four levels 100, 110, 120, and 130 and thus represent two binary bits of the digital data. The threshold voltage level 130 being the erased voltage level as well as the voltage level for the digital data for a digital 11. An array of the SONOS/MONOS dual-sided flash memory cells will be programmed sufficiently long such that the distribution of the threshold voltages ($V_t$) 102, 112, 122, and 132 allow the setting of the word line voltage and thus the control gates of the array to the program verify voltages VPV1 105, VPV2 115, and VPV3 125. During a read operation the control gate is set at each voltage level to determine the threshold voltage $V_t$ representing the two bits of the digital data stored in each of the charge trapping layers.

The plot of the distribution of an array of SONOS/MONOS dual-sided flash memory cells versus the threshold voltage $V_t$ of FIG. 2c illustrates eight threshold voltage levels 200, 210, 220, 240, . . . , and 250 for a three binary digits stored in each of the charge trapping regions of the SONOS/MONOS dual-sided flash memory cells. Again, the programming time is adjusted to provide the distribution 202, 212, 222, 242, and 252 of the SONOS/MONOS dual-sided flash memory cells such that the program voltages VPV1 205, VPV2 215, VPV3 225, . . . , VPV7 236, and the erase voltage VEV 245 applied sequentially as the word line voltage to the control gates of the SONOS/MONOS dual-sided flash memory cells detect the programmed state of the SONOS/MONOS dual-sided flash memory cells.

Figure 3:
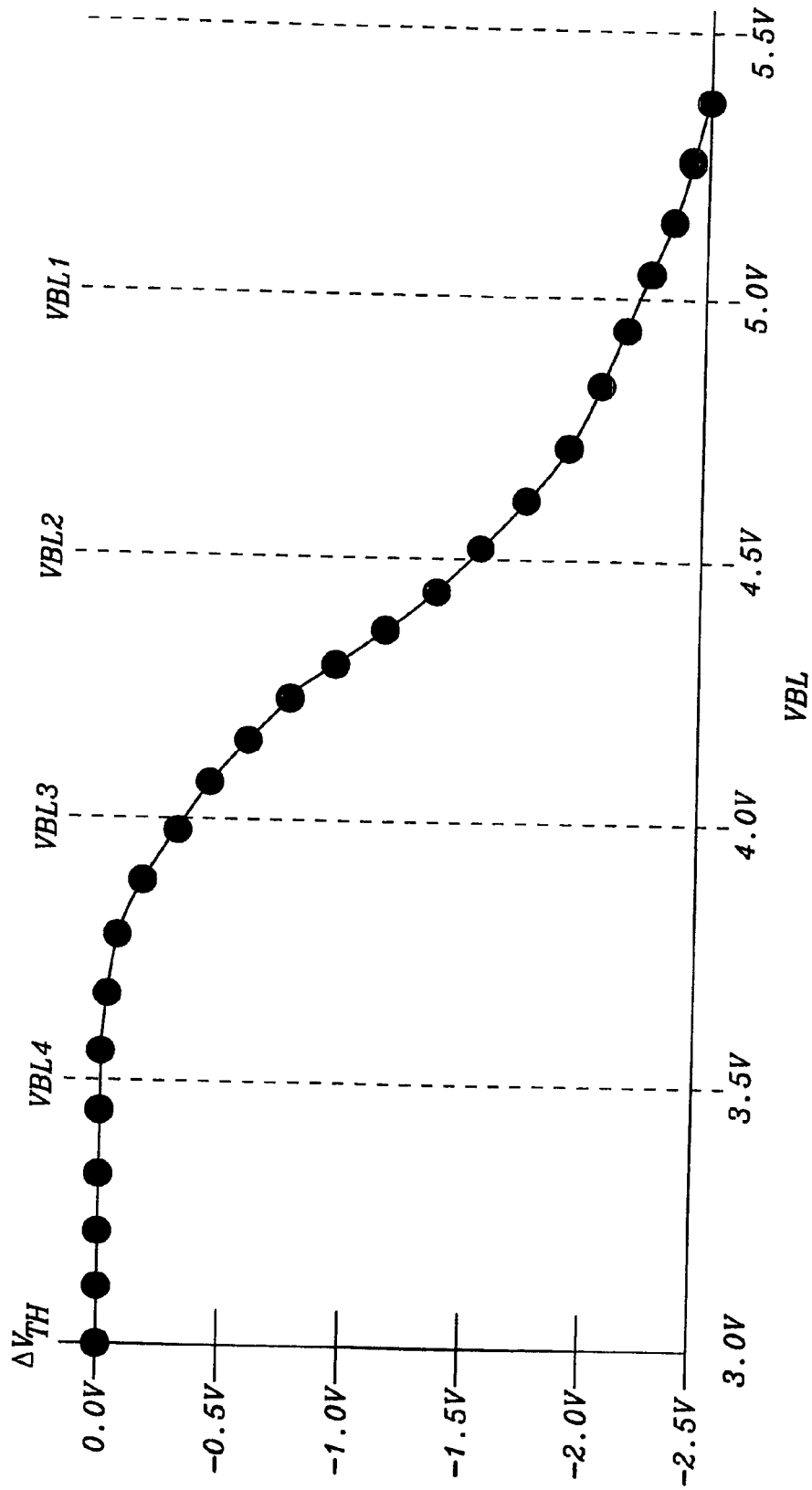
FIG. 3 is a plot of a change in threshold voltage $V_t$ versus an applied positive voltage at the drain/source of a NMOS dual-sided charge-trapping nonvolatile memory cell for a fixed program time of 150 μS and a fixed negative gate voltage of −7V of the programming circuit of the control apparatus of this invention.

FIG. 3 is a plot of the change in threshold voltage ($\Delta V_t$) versus the applied voltage at the drain or source of the SONOS/MONOS dual-sided flash memory cell with a fixed program time and a fixed gate voltage of opposite polarity for a single sided programming of the SONOS/MONOS dual-sided flash memory cell. In the example shown, the SONOS/MONOS dual-sided flash memory cell is an n-channel device where the word line voltage and thus the control gate is set to −7V for a period of 150 μS. Regardless of which of the two charge trapping regions that is to be programmed, the threshold voltage ($V_t$) is decreased as the voltage is increased at drain and source. This is indicative that the drain or source voltage plays an important role to control the threshold voltage ($V_t$) of the multiple level structure of the SONOS/MONOS dual-sided flash memory cells.

The threshold voltage ($V_t$) control of either the first or second charge trapping regions respectively adjoining the drain and source regions of the SONOS/MONOS dual-sided flash memory cell is performed under Band-to-Band hole-injection program independently. This is referred as one-side program for the SONOS/MONOS dual-sided flash memory cell. Due to the crosstalk program disturb effect, the first programmed threshold voltage ($V_t$) of either first charge trapping region adjoining the drain or the second charge trapping region adjoining the source will be lowered while subsequently programming the charge trapping region at the opposite side of the channel region of the SONOS/MONOS dual-sided flash memory cells. FIG. 3 as shown illustrates four threshold voltage ($V_t$) levels such as VBL4, VBL3, VBL2 and VBL1 are shown.

In the examples of the threshold voltages ($V_t$) as shown the values of the applied to the drain or source respective through the first bit line or the second bit line are VBL4=3.5V, VBL3=4.0V, VBL2=4.5V, and VBL1=5.0V. When the voltages as shown are applied to the first bit line or the second bit line and thus to the drain and source for a program time of 150 μS, the change in threshold voltage level ΔVt would not alter if bit line voltage level VBL4 is applied to either drain or source terminal. Similarly, the change in threshold voltage level ΔVt will be approximately 0.7V when the bit line voltage level VBL3 is applied to either drain or source terminal. The change in threshold voltage level ΔVt will be approximately 1.7V if bit line voltage level VBL2 is applied to either drain or source terminal. The change in threshold voltage level ΔVt will be approximately 2.5V if bit line voltage level VBL1 is applied to either drain or source terminal.

Figure 4:
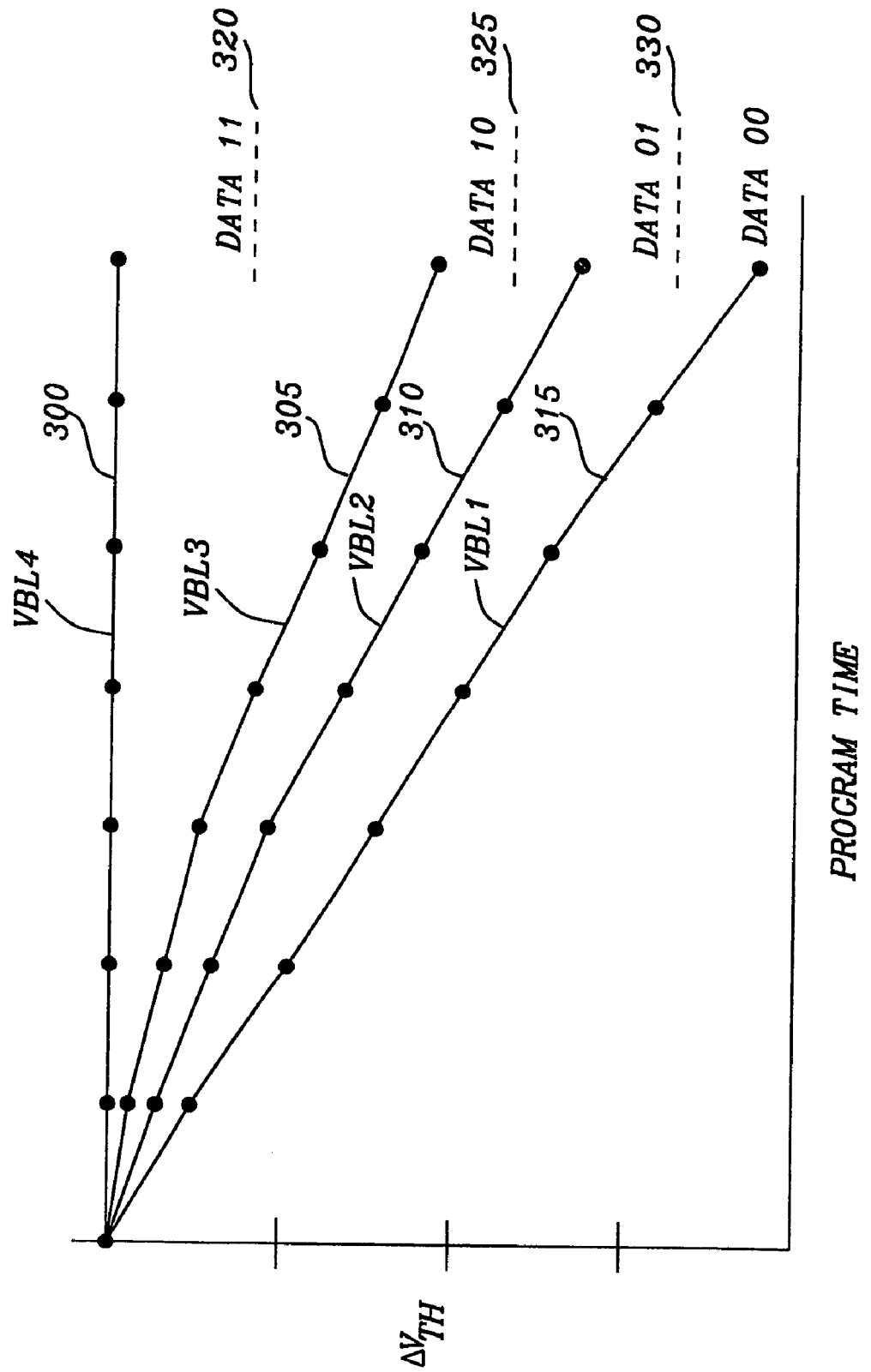
FIG. 4 is a plot of a change in threshold voltage versus program time for the applied positive voltage at the drain/source of a NMOS dual-sided charge-trapping nonvolatile memory cell to establish four voltage levels representing the two digital data bits by the programming circuit of the control apparatus of this invention.

Refer now to FIG. 4 for a discussion of the programming of one of the charge trapping regions of the SONOS/MONOS dual-sided flash memory cell. The graph illustrates the change in threshold voltage level ($\Delta V_t$) versus the program time under a fixed large control gate voltage as applied to the word line terminal. Each plot shows the program time versus the change in threshold voltage level ($\Delta V_t$) for the differing bit line voltage levels as applied to the either the drain or the source of the SONOS/MONOS dual-sided flash memory cell. The longer the duration of the program time and the larger magnitude of the bit line voltage level applied to drain or source, the SONOS/MONOS dual-sided flash memory cell change in threshold voltage level ($\Delta V_t$) is controlled to a desired lower level. FIG. 4 clearly demonstrates that control of the program time and bit line voltage level applied to the drain or source provides an accurate multiple level program states of the threshold voltage level ($V_t$) representing the binary bit values is achievable.

Each of the plots 300, 305, 310, and 315 represents the change in threshold voltage level ($\Delta V_t$) versus the program time for each of the bit line voltage levels VBL4, VBL3, VBL2 and VBL1. The program operation uses Band-to-Band, hot-carrier injection scheme (hot-hole injection for this example of an n-channel SONOS/MONOS dual-sided flash memory cell) for both first charge trapping region and the second charge trapping of SONOS/MONOS dual-sided flash memory cell. The programming time of the charge trapping region is set such that the change in threshold voltage level ($\Delta V_t$) falls centrally in the regions between the boundaries of the changes in threshold voltage level ($\Delta V_t$) that define the binary digit representations 320, 325, 330, and 315 (not shown in FIG. 4?).

Figure 5:
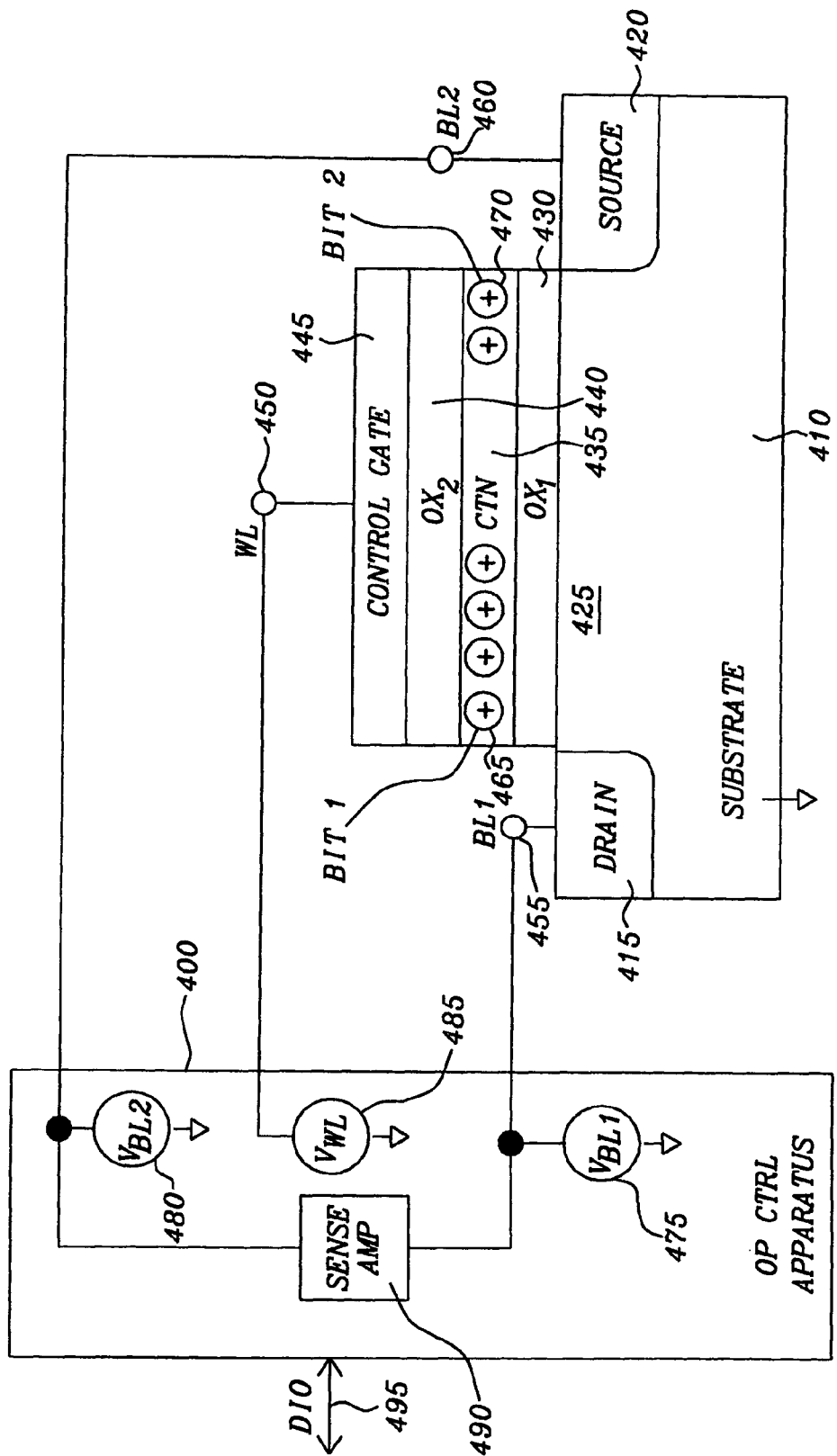
FIG. 5 is a cross sectional view of a NMOS dual-sided charge-trapping nonvolatile memory cell illustrating the charge trapping regions of the charge trapping layer as programmed by the programming circuit of the control apparatus of this invention.

Refer now to FIG. 5 for a discussion of a control apparatus 400 of this invention for operation of a SONOS/MONOS dual-sided flash memory cell 405 for programming, reading, and erasing trapped charges representing multiple digital data bits within two charge trapping regions 465 and 470. The SONOS/MONOS dual-sided flash memory cell 405 is essentially structured as shown in FIG. 1a. The SONOS/MONOS dual-sided flash memory cell 405 is formed within a substrate 410. A drain region 415 and source region 420 are formed within the substrate 410. A relatively thin gate oxide or tunneling oxide 430 is deposited on the substrate 410. A charge trapping layer 435 is then formed over the oxide layer 430 above the channel region 425 between drain region 415 and source region 420. A second dielectric oxide layer 440 is placed on top of charge trapping layer 435 to separate the charge trapping layer 435 from a conductive layer 445 such as poly-crystalline silicon or metal (aluminum or copper). The conductive layer 445 forms the control gate of the dual-sided charge-trapping nonvolatile memory cell 405. The control gate 445 of the SONOS/MONOS dual-sided flash memory cell 405, when placed in an array of dual-sided charge-trapping nonvolatile memory cells 5, is connected to a word line terminal 450. The drain 415 is connected to a first bit line terminal 455 and to the source 420 is connected to a second bit line terminal 455. The SONOS/MONOS dual-sided flash memory cell 405 the digital data bits as trapped charge within the charge trapping layer 435 above the channel 425 that is formed between drain 415 and source 420. Multiple digital data bits are stored simultaneously in the two separate charge trapping regions 465 and 470.

The control apparatus 400 of this invention has a first bit line voltage source 475 that is connected to the first bit line terminal 455 and thus to the drain region 415. The second bit line voltage source 480 is connected to the second bit line terminal 460 and thus to the source region 420. The word line voltage source 485 is connected to the word line terminal 450 and thus to the control gate 445. The first bit line voltage source 475, the second bit line voltage source 480, and the word line voltage source 485 provide the necessary voltage levels for the programming, reading, and erasing the trapped charges from the first and second charge trapping regions 465 and 470 of the charge trapping layer 435.

To program the SONOS/MONOS dual-sided flash memory cell 405, the control apparatus 400 of this invention sets the first bit line voltage source 475, the second bit line voltage source 480, and word line voltage source 485 as shown in FIG. 6a. The word line voltage source 485 is set to provide a word line program voltage level of from approximately −7.0V to approximately −10.0V for an n-channel SONOS/MONOS dual-sided flash memory cell 405. Alternately, if the SONOS/MONOS dual-sided flash memory cell 405 is a p-channel device the word line voltage level is from approximately +7.0V to approximately +10.0V. It should be noted that the hot carrier charges in the n-channel SONOS/MONOS dual-sided flash memory cell 405 are hot-holes and in the p-channel SONOS/MONOS dual-sided flash memory cell 405 are hot-electrons. The program state of the charge trapping regions 465 and 470 being determined by the number of hot-carriers injected into each of the charge trapping regions 465 and 470.

To program the first charge trapping region 465 and the second charge trapping region 470 simultaneously, the first bit line voltage source 475 is set to the bit line voltage level ($V_{BLN}$) that represents the digital data to programmed to the first charge trapping region 465 and the second bit line voltage source 480 is set to the bit line voltage level ($V_{BLN}$) that represents the digital data to programmed to the second charge trapping region 470. For example if there are to be two binary digits programmed to each of the charge trapping regions 465 and 470, the first bit line voltage source 475 and the second bit line voltage source 480 are set according to the voltage levels according to Table 1.

TABLE 1

| Binary Digit to first charge trapping region 465 | Binary Digit to second charge trapping region 470 | $V_{BL1}$ 475 Level | $V_{BL2}$ 480 Level |
|---|---|---|---|
| 00 | 00 | VBL1 | VBL1 |
| 00 | 01 | VBL1 | VBL2 |
| 00 | 10 | VBL1 | VBL3 |
| 00 | 11 | VBL1 | VBL4 |
| 01 | 00 | VBL2 | VBL1 |
| 01 | 01 | VBL2 | VBL2 |
| 01 | 10 | VBL2 | VBL3 |
| 01 | 11 | VBL2 | VBL4 |
| 10 | 00 | VBL3 | VBL1 |
| 10 | 01 | VBL3 | VBL2 |
| 10 | 10 | VBL3 | VBL3 |

TABLE 1-continued

| Binary Digit to first charge trapping region 465 | Binary Digit to second charge trapping region 470 | $V_{BL1}$ 475 Level | $V_{BL2}$ 480 Level |
|---|---|---|---|
| 10 | 11 | VBL3 | VBL4 |
| 11 | 00 | VBL4 | VBL1 |
| 11 | 01 | VBL4 | VBL2 |
| 11 | 10 | VBL4 | VBL3 |
| 11 | 11 | VBL4 | VBL4 |

To program the first charge trapping region 465 and the second charge trapping region 470 sequentially, the first bit line voltage source 475 is set to the bit line voltage level ($V_{BLN}$) that represents the digital data to programmed to the first charge trapping region 465 and the second bit line voltage source 480 is set to the ground reference voltage level. For example if there are to be two binary digits programmed to the first charge trapping region 465, the first bit line voltage source 475 and the second bit line voltage source 480 are set according to the voltage levels according to Table 2.

TABLE 2

| Binary Digit to first charge trapping region 465 | $V_{BL1}$ 475 Level | $V_{BL2}$ 480 Level |
|---|---|---|
| 00 | VBL1 | 0 V |
| 01 | VBL2 | 0 V |
| 10 | VBL3 | 0 V |
| 11 | VBL4 | 0 V |

Then, the first bit line voltage source 475 is set to the ground reference voltage level and the second bit line voltage source 480 is set to the bit line voltage level ($V_{BLN}$) that represents the digital data to be programmed to the second charge trapping region 4470. For example if there are to be two binary digits programmed to the second charge trapping region 470, the first bit line voltage source 475 and the second bit line voltage source 480 are set according to the voltage levels according to Table 3.

TABLE 3

| Binary Digit to second charge trapping region 470 | $V_{BL1}$ 475 Level | $V_{BL2}$ 480 Level |
|---|---|---|
| 00 | 0 V | VBL1 |
| 01 | 0 V | VBL2 |
| 10 | 0 V | VBL3 |
| 11 | 0 V | VBL4 |

In the example of FIG. 3, the bit line voltage levels are VBL4=3.5V, VBL3=4.0V, VBL2=4.5V, and VBL1=5.0V. It should be noted that these are approximate and may vary as needed for a particular application. Further, the example illustrates two bits of binary digital data stored in each of the charge trapping regions 465 and 470. As noted in Atwood, et al., "The charge storage ability of the flash memory cell is a key to the storage of multiple bits in a single cell. The flash cell is an analog storage device not a digital storage device. It stores charge (quantized at a single electron) not bits." The control apparatus 400 of this invention places a precise amount of charge in the charge trapping regions 465 and 470 such that in an array of the SONOS/MONOS dual-sided flash memory cells 405 the distribution as shown in FIGS. 2b and 2c are sufficiently restricted that program states of each of the charge trapping regions 465 and 470 are detectable. Assuming the ability to differentiate the differences in threshold voltage levels ($\Delta V_t$) for each binary digit of the programmed data, any number of bits conceptually may be programmed by the control apparatus 400 of this invention to the charge trapping regions 465 and 470 of the SONOS/MONOS dual-sided flash memory cell 405.

For a discussion now of the erase of the SONOS/MONOS dual-sided flash memory cell 405 by the control apparatus 400 of this invention, refer now to FIG. 6c. To remove the hot carriers injected during the programming of the SONOS/MONOS dual-sided flash memory cell 405, the word line voltage source 485 is set to provide a word line erase voltage level of from approximately +15V to approximately +20V for an n-channel SONOS/MONOS dual-sided flash memory cell 405. Alternately, if the SONOS/MONOS dual-sided flash memory cell 405 is a p-channel device the word line erase voltage level is from approximately −15V to approximately −20V It should be noted that the hot carrier charges in the n-channel SONOS/MONOS dual-sided flash memory cell 405 are hot-holes and in the p-channel SONOS/MONOS dual-sided flash memory cell 405 are hot-electrons. The first bit line voltage source 475 and the second bit line voltage source 480 are set to the ground reference voltage level (0V) for a complete erase. In an array configuration, certain cells require that they not be subjected to the erasure operation. In this circumstance, the first bit line voltage source 475 and the second bit line voltage source 480 are set to an inhibit voltage level of from approximately +7.5V to approximately +10.0V.

A read operation of the SONOS/MONOS dual-sided flash memory cell 405, is where the first charge trapping region 465 is read in one direction and the second charge trapping region 470 is read in the opposite direction. During each directional read operation, a word line read voltage level must be varied to determine the threshold of the SONOS/MONOS dual-sided flash memory cell 405 as determined by the first and second charge trapping regions 465 and 470. As shown in FIG. 6d, the control apparatus 400 of this invention provides the control voltages for the read operation. For reading the program state of the first charge trapping region 465, the word line voltage source 485 is set to the read voltage level ($V_{READ}$). The first bit line voltage source 475 is set to the ground reference voltage level (0V) and the second bit line voltage source 480 is set to the drain read voltage ($V_{DRAIN}$). As noted above, the read voltage level ($V_{READ}$) must be varied incrementally through each of the threshold boundary voltage levels (VPVn) as shown in FIGS. 2b and 2c to determine the program state of the first charge trapping region 465. For reading the program state of the second charge trapping region 470, the word line voltage source 485 is set to the read voltage level ($V_{READ}$). The first bit line voltage source 475 is set to the drain read voltage ($V_{DRAIN}$) and the second bit line voltage source 480 is set to the ground reference voltage level (0V). Again, as noted above, the read voltage level ($V_{READ}$) must be varied incrementally through each of the threshold boundary voltage levels (VPVn) as shown in FIGS. 2b and 2c to determine the program state of the second charge trapping region 470.

During the read operation, the sense amplifier 490 of FIG. 5 determines whether the SONOS/MONOS dual-sided flash memory cell 405 is conducting or not in each direction. Based on the threshold boundary voltage level (VPVn) and the conduction of the SONOS/MONOS dual-sided flash memory cell 405, the sense amplifier 490 determines the binary digital data programmed in each charge trapping regions 465 and 470 and transfers the binary digital data to external circuitry through the data input/output bus 495.

Figure 7:
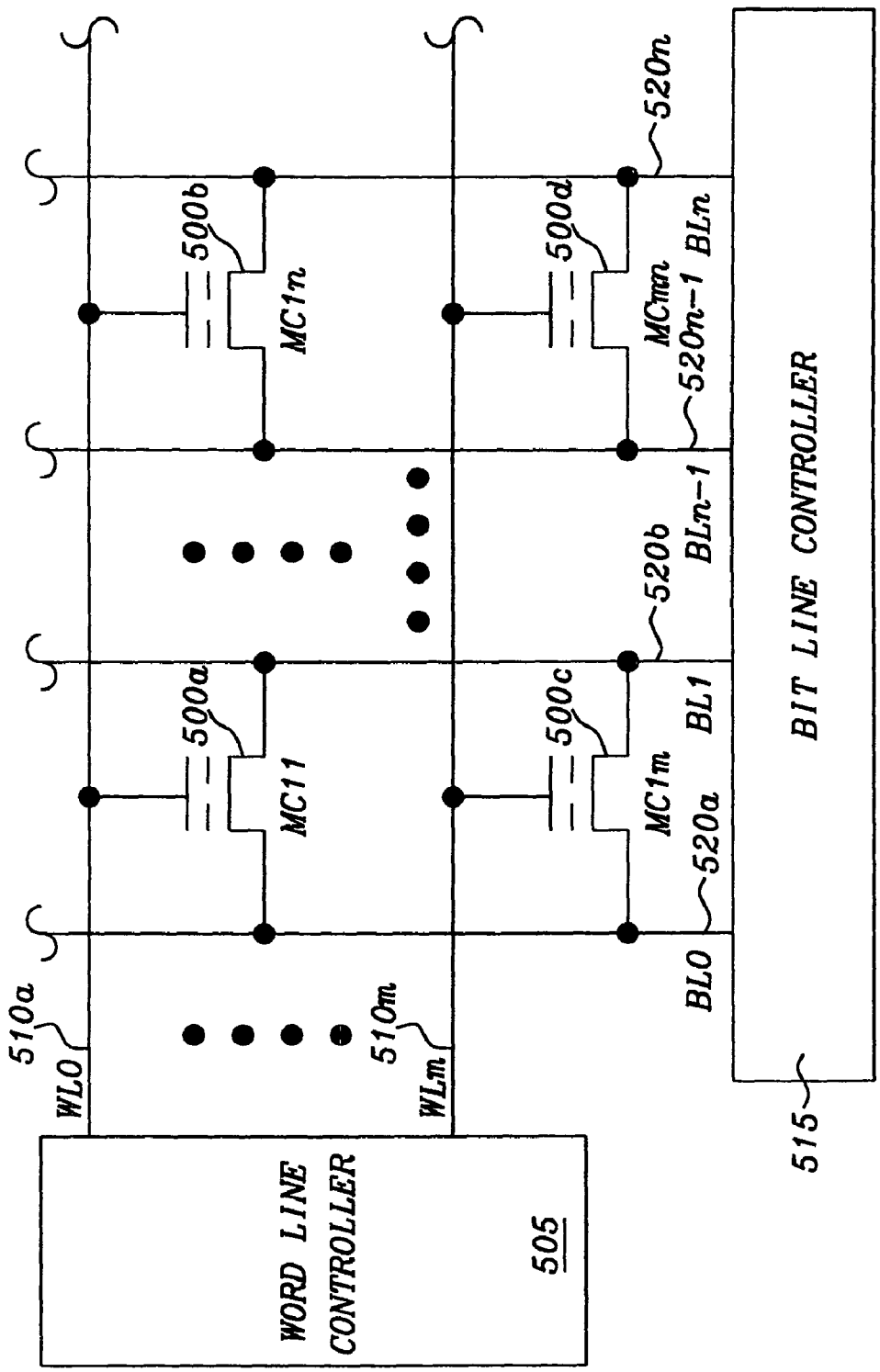
FIG. 7 is a schematic diagram of an NOR-type array of NMOS dual-sided charge-trapping nonvolatile memory cells that are programmed, read, and erased by the programming circuit of the control apparatus of this invention.

To form an integrated nonvolatile memory, multiple SONOS/MONOS dual-sided flash memory cells 405 of FIG. 5 are arranged in an array as shown in FIG. 7. The SONOS/MONOS dual-sided flash memory cells 500a, 500b, 500c, and 500d are arranged in rows and columns. The control gates of each of the SONOS/MONOS dual-sided flash memory cells 500a, 500b, 500c, and 500d each row are connected together to one of the word lines 510a, ..., 510n. The word lines 510a, ..., 510n are connected to the word line controller 505. The word line controller 505 generates the word line program, erase, and read voltages for the operation of the SONOS/MONOS dual-sided flash memory cells 500a, 500b, 500c, and 500d. The drains and source of each of the SONOS/MONOS dual-sided flash memory cells 500a, 500b, 500c, and 500d of each columns of the array of SONOS/MONOS dual-sided flash memory cells 500a, 500b, 500c, and 500d are connected pair wise to the bit lines 520a, 520b, ..., 520n-1, 520n. One of the bit lines 520a, 520b, ..., 520n-1, 520n being connected to the drain and one of the bit lines 520a, 520b, ..., 520n-1, 520n connected to the source of the SONOS/MONOS dual-sided flash memory cells 500a, 500b, 500c, and 500d. The bit lines 520a, 520b, ..., 520n-1, 520n are then connected to the bit line controller to generate the necessary bit line program, erase, and read voltages for the operation of the SONOS/MONOS dual-sided flash memory cells 500a, 500b, 500c, and 500d. As shown, the array structure of FIG. 7 is a one-transistor NOR flash memory array.

The word line controller 505 and the bit line controller 515 function in concert as the control apparatus for operation of SONOS/MONOS dual-sided flash memory cells 500a, 500b, 500c, and 500d. Refer now to FIGS. 8a and 8b for a description of a program operation of the array of SONOS/MONOS dual-sided flash memory cells 500a, 500b, 500c, and 500d. In FIG. 8a, the voltage levels describe the simultaneous injection of the programming charge to the charge trapping regions of the selected row of the SONOS/MONOS dual-sided flash memory cells 500a, 500b, 500c, and 500d. In FIG. 8b, the voltage levels describe the sequential injection of the programming charge to the charge trapping regions of the selected row of the SONOS/MONOS dual-sided flash memory cells 500a, 500b, 500c, and 500d. A selected row, for instance those SONOS/MONOS dual-sided flash memory cells 500a, ..., 500b connected to the word line 500a, has the word line program voltage level ($V_{PGM}$) applied to the associated word line 510a and thus to the control gates of the SONOS/MONOS dual-sided flash memory cells 500a, ..., 500b. The non-selected rows of SONOS/MONOS dual-sided flash memory cells ..., 500c, ..., 500d are connected to the remaining word lines ..., 500m of the array. The word line controller sets these word lines ..., 500m and thus the non-selected SONOS/MONOS dual-sided flash memory cells ..., 500c, ..., 500d to the ground reference voltage level (0).

The bit line controller generates the bit line program voltage levels ($V_{BLN}$) necessary for simultaneously programming each of the charge trapping regions of the SONOS/MONOS dual-sided flash memory cells 500a, ... 500b of the selected row. These levels are set based on the binary digital data to be stored as the trapped charge in the first and second charge trapping regions of the selected SONOS/MONOS dual-sided flash memory cells 500a, ..., 500b. Examples of these simultaneous bit line levels of the binary digital data are shown in Table 1. Alternately, the sequential programming of the charge trapping regions have one of the pair of bit lines connected to the source or drain of the selected SONOS/

MONOS dual-sided flash memory cells 500a, ..., 500b as in Table 2 or Table 3. Then the second of the pair of bit lines connected to the source or drain of the selected SONOS/MONOS dual-sided flash memory cells 500a, ..., 500b as in the applied voltages of Tables 2 or 3.

Erasure of the array of NMOS SONOS/MONOS dual-sided flash memory cells 500a, 500b, 500c, and 500d is illustrated in FIG. 8c. The erasure is shown as a row wise erase, where a selected row received a word line erase voltage level ($V_{ERS}$) from the word line 510a as applied by the word line controller 505. The word line erase voltage level of from approximately +15V to approximately +20V for an n-channel SONOS/MONOS dual-sided flash memory cells 500a, ..., 500b. Alternately, if the SONOS/MONOS dual-sided flash memory cells 500a, ..., 500b is a p-channel device the word line erase voltage level is from approximately −15V to approximately −20V. The word line controller 505 applies the ground reference voltage level (0V) to the non-selected word lines ..., 510m and thus to the SONOS/MONOS dual-sided flash memory cells ..., 500c, ..., 500d to prevent removal of the trapped charges from the first and second charge trapping regions of the SONOS/MONOS dual-sided flash memory cells ..., 500c, 500d.

The bit line controller applies the ground reference voltage level (0V) to each of the bit lines 520a, 520b, ..., 520n-1, 520n for a complete erase. In an array configuration, certain cells require that they not be subjected to the erasure operation. In this circumstance, the bit line controller 515 applies an inhibit voltage level of from approximately +7.5V to approximately +10V to those bit lines 520a, 520b, ..., 520n-1, 520n that are sufficiently erase and do not require further erasure.

Refer now to FIG. 8d for the explanation of the reading of a selected row of the SONOS/MONOS dual-sided flash memory cells 500a, 500b, 500c, and 500d. A selected row, for instance those SONOS/MONOS dual-sided flash memory cells 500a, ..., 500b connected to the word line 500a, has the word line read voltage level ($V_{READ}$) applied to the associated word line 510a and thus to the control gates of the SONOS/MONOS dual-sided flash memory cells 500a, ..., 500b. The non-selected rows of NMOS SONOS/MONOS dual-sided flash memory cells ..., 500c, ..., 500d are connected to the remaining word lines ..., 500m of the array. The word line controller sets these word lines ..., 500m and thus the non-selected SONOS/MONOS dual-sided flash memory cells ..., 500c, ..., 500d to a word line read pass voltage level ($V_{PASS}$). The word line read pass voltage level ($V_{PASS}$) insures that the non-selected rows of SONOS/MONOS dual-sided flash memory cells ..., 500c, ..., 500d are not activated during the read operation.

To read the first charge trapping region of the selected rows of SONOS/MONOS dual-sided flash memory cells 500a, ..., 500b, the bit line controller sets those of the bit lines 520a, 520b, ..., 520n-1, 520n connected to the first charge trapping regions to the ground reference voltage level (0V) and those of the bit lines 520a, 520b, ..., 520n-1, 520n connected to the second charge trapping regions to the drain read voltage ($V_{DRAIN}$). As noted above, the read voltage level ($V_{READ}$) must be varied incrementally through each of the threshold boundary voltage levels (VPVn) as shown in FIGS. 2b and 2c to determine the program state of the first charge trapping region of each of the selected SONOS/MONOS dual-sided flash memory cells 500a, ..., 500b. For reading the program state of the second charge trapping region of the selected SONOS/MONOS dual-sided flash memory cells 500a, ..., 500b, the bit line controller sets those of the bit lines 520a, 520b, ..., 520n-1, 520n connected to the first charge trapping regions to the drain read voltage ($V_{DRAIN}$) and those of the bit lines 520a, 520b, ..., 520n-1, 520n connected to the second charge trapping regions to the ground reference voltage level (0V). Again, as noted above, the read voltage level ($V_{READ}$) must be varied incrementally through each of the threshold boundary voltage levels (VPVn) as shown in FIGS. 2b and 2c to determine the program state of the second charge trapping region of each of the selected SONOS/MONOS dual-sided flash memory cells 500a, ..., 500b.

During the read operation, a sense amplifier within the word line controller 515 determines whether the selected SONOS/MONOS dual-sided flash memory cells 500a, ..., 500b are conducting or not in each direction. Based on the threshold boundary voltage level (VPVn) and the conduction of the selected SONOS/MONOS dual-sided flash memory cells 500a, ..., 500b, the sense amplifier determines the binary digital data programmed in each charge trapping regions of the selected SONOS/MONOS dual-sided flash memory cells 500a, ..., 500b and transfers the binary digital data to external circuitry through an data input/output bus.

Figure 9:
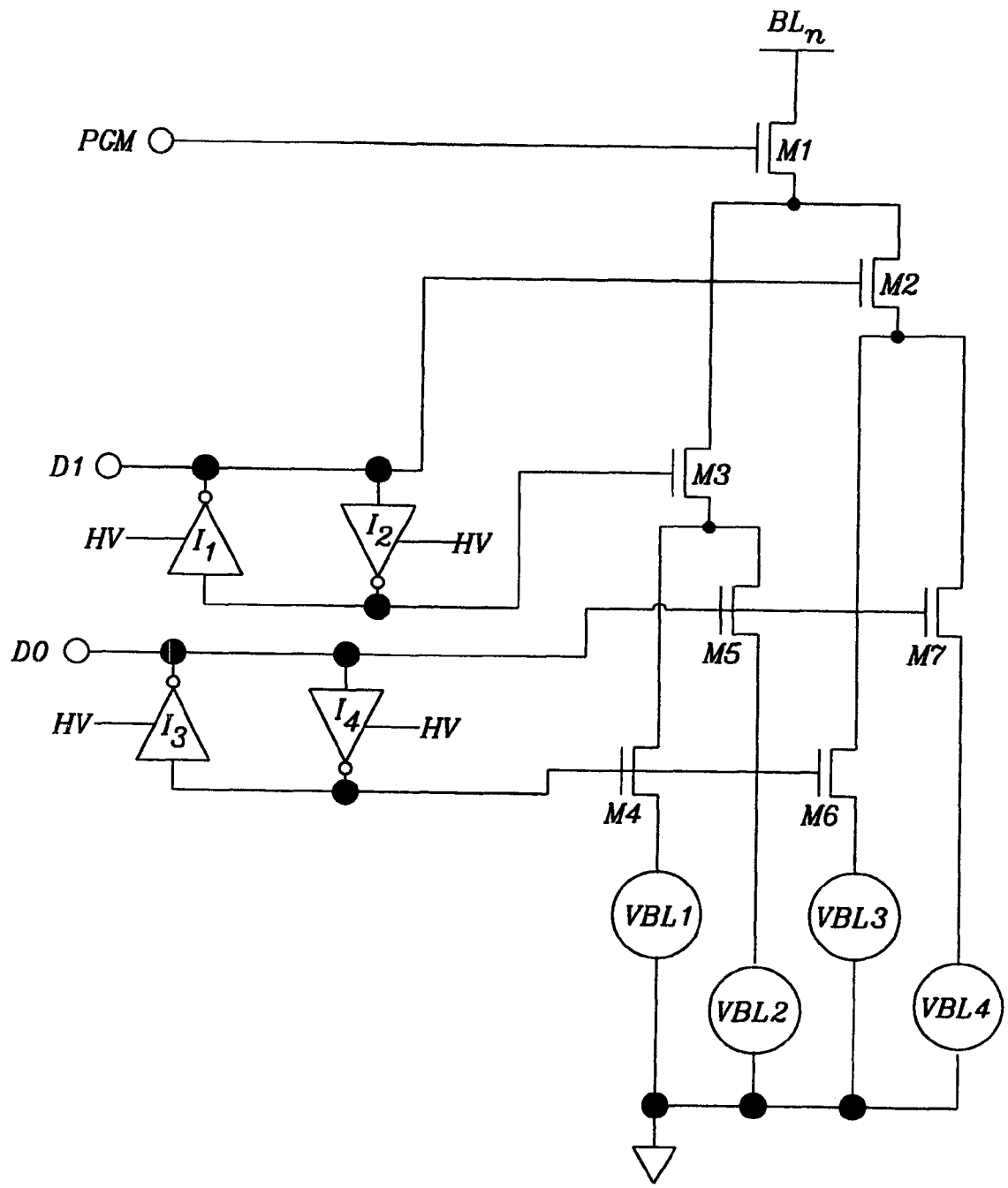
FIG. 9 is a schematic diagram of an programming segment of a bit line control circuit for applying the program voltages to the drain/source of a selected dual-sided charge-trapping nonvolatile memory cell for programming a selected a NMOS dual-sided charge-trapping nonvolatile memory cell by the control apparatus of this invention.

In FIG. 9, the programming segment of the bit line controller provides the bit line program voltage levels (VBLn) as required for storing the binary data to bit line connected to the drain or source of a selected SONOS/MONOS dual-sided flash memory cell. The Metal Oxide Semiconductor (MOS) transistor M1 acts as a select gate for activating the programming segment. The drain of the MOS transistor M1 is connected to the bit line $BL_n$ that is connected to a drain or source of a of each of the selected SONOS/MONOS dual-sided flash memory cell that is to receive the bit line programming voltage level VBL1, VBL2, VBL3, or VBL4 representative of the binary data. In the case, as shown, the binary data is two binary digits D0 and D1. The MOS transistors M2, M3, M4, M5, and M6 form a selection circuit which is activated by the two binary digits D0 and D1. The inverter circuits $I_1$ and $I_2$ and inverter circuits $I_3$, and $I_4$ are cross coupled to form a latching circuit for maintaining the voltages at the gates of the MOS transistors M2, M3, M4, M5, M6 and M7. The two binary digits D0 and D1 provide the bit line programming voltage level VBL1, VBL2, VBL3, or VBL4 representative of the binary data according to Table 4.

TABLE 4

| Binary Digits D0 and D1 | $V_{BLn}$ Level |
| --- | --- |
| 00 | VBL1 |
| 01 | VBL2 |
| 10 | VBL3 |
| 11 | VBL4 |

The bit line programming voltage sources VBL1, VBL2, VBL3, and VBL4 have voltage levels sufficient to change the threshold voltage level ($V_t$) of the selected SONOS/MONOS dual-sided flash memory cell as shown in FIG. 4. The High voltage source connected to each of the inverter circuits $I_1$, $I_2$, $I_3$, and $I_4$ is sufficiently large to allow activation of the MOS transistors M2, M3, M4, M5, M6 and M7 having the bit line programming voltage sources VBL1, VBL2, VBL3, and VBL4 connected to their sources.

Figure 10:
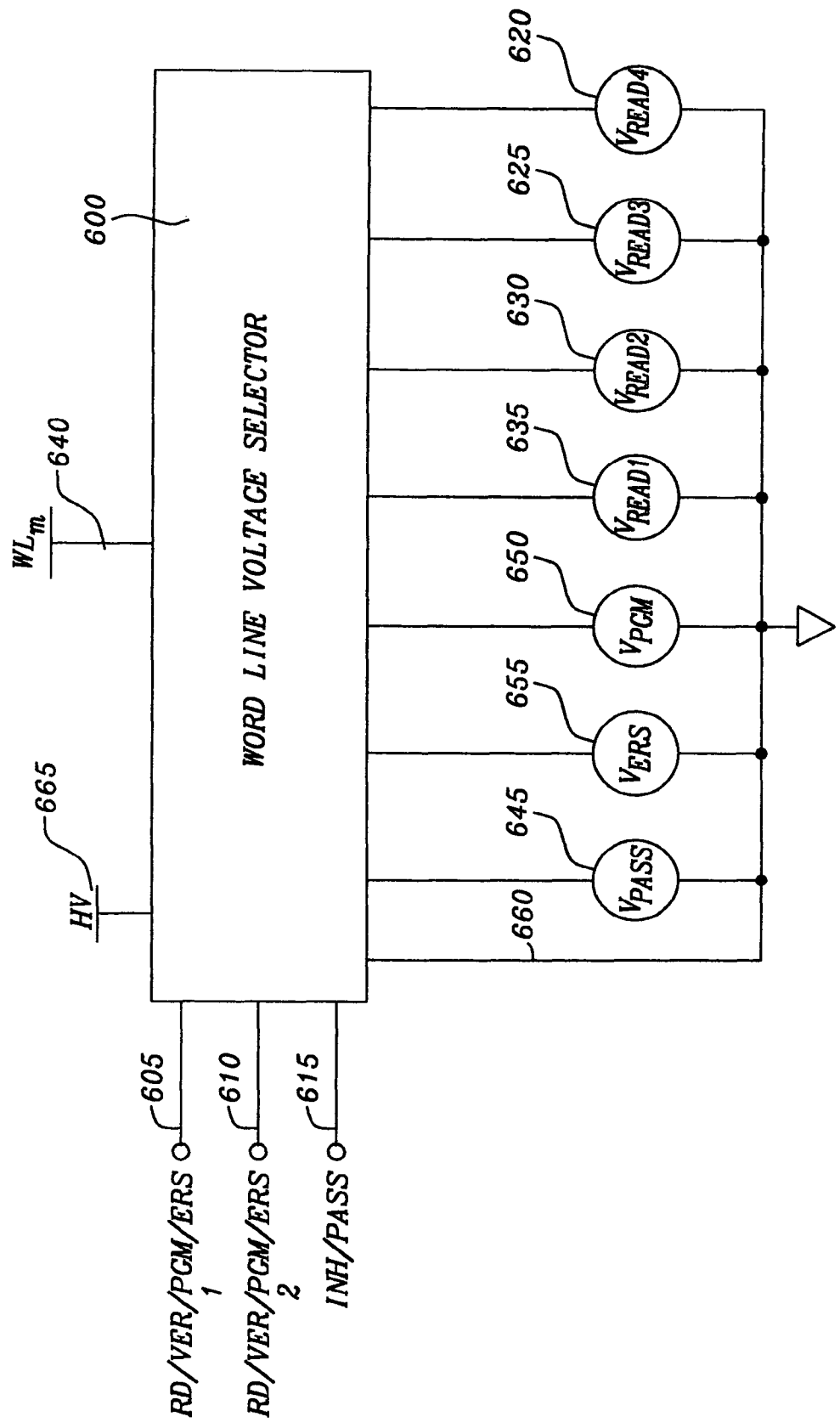
FIG. 10 is a functional block diagram of a section of the read circuit for applying positive voltages at the control gate of a selected dual-sided charge-trapping nonvolatile memory cell for reading the selected a dual-sided charge-trapping nonvolatile memory cell by the control apparatus of this invention.

FIG. 10 illustrates the word line voltage selector 600 of the word line controller 505 of FIG. 7. The word line voltage selector 600 receives a Read/Verify/Program/Erase command code 605 and 610 that determines whether a Read, Verify, Program, or Erase operation is to be performed. During a read operation or a program verify operation, the Read/

Verify/Program/Erase command code 605 and 610 is set to perform the read and the word line voltage selector 600 is sequentially activates the word line read voltage sources 620, 625, 630, and 635 to apply the appropriate voltage levels to the word line 640 to determine the program state of each of the charge trapping region of the selected SONOS/MONOS dual-sided flash memory cells 500a, . . . , 500b of FIG. 7.

If the row of the SONOS/MONOS dual-sided flash memory cells 500a, 500b, 500c, and 500d, are non-selected rows of SONOS/MONOS dual-sided flash memory cells . . . , 500c, . . . , 500d of FIG. 7, the Inhibit/Pass signal 615 is activated. The word line pass voltage source 645 is activated to transfer the word line pass voltage ($V_{PASS}$) to the word line 640.

During a program operation, the Read/Verify/Program/Erase command code 605 and 610 is set to perform the program and the word line voltage selector 600 is activates the word line program voltage source 650 to apply the program voltage level $V_{PGM}$ to the word line 640. The program voltage level $V_{PGM}$ provides the necessary voltage field within the charge trapping region of the selected SONOS/MONOS dual-sided flash memory cells 500a, . . . , 500b of FIG. 7 to activate the hot-carrier injection to the charge trapping region.

If the row of the SONOS/MONOS dual-sided flash memory cells 500a, 500b, 500c, and 500d, are non-selected rows of SONOS/MONOS dual-sided flash memory cells . . . , 500c, . . . , 500d of FIG. 7, the Inhibit/Pass signal 615 is activated. The ground reference voltage source 660 is transferred to the word line 640.

For an erase operation, the Read/Verify/Program/Erase command code 605 and 610 is set to perform the erase and the word line voltage selector 600 is sequentially activates the word line erase voltage source 655 to apply the word line erase voltage level to the word line 640 to remove the injected hot-carriers from the charge trapping region of the selected SONOS/MONOS dual-sided flash memory cells 500a, . . . , 500b of FIG. 7.

If the row of the SONOS/MONOS dual-sided flash memory cells 500a, 500b, 500c, and 500d, are non-selected rows of SONOS/MONOS dual-sided flash memory cells . . . , 500c, . . . , 500d of FIG. 7, the Inhibit/Pass signal 615 is activated. The ground reference voltage source 660 transferred to the word line 640.

The word line voltage selector 600 is connected to a high voltage source 665. The high voltage source 665 provides the voltage of sufficient magnitude to allow activation of the transfer of the voltage levels of the word line read voltage sources 620, 625, 630, and 635, the word line pass voltage source 645, the word line program voltage source 650, and the erase voltage source 655 to the word line 640.

Figure 11:
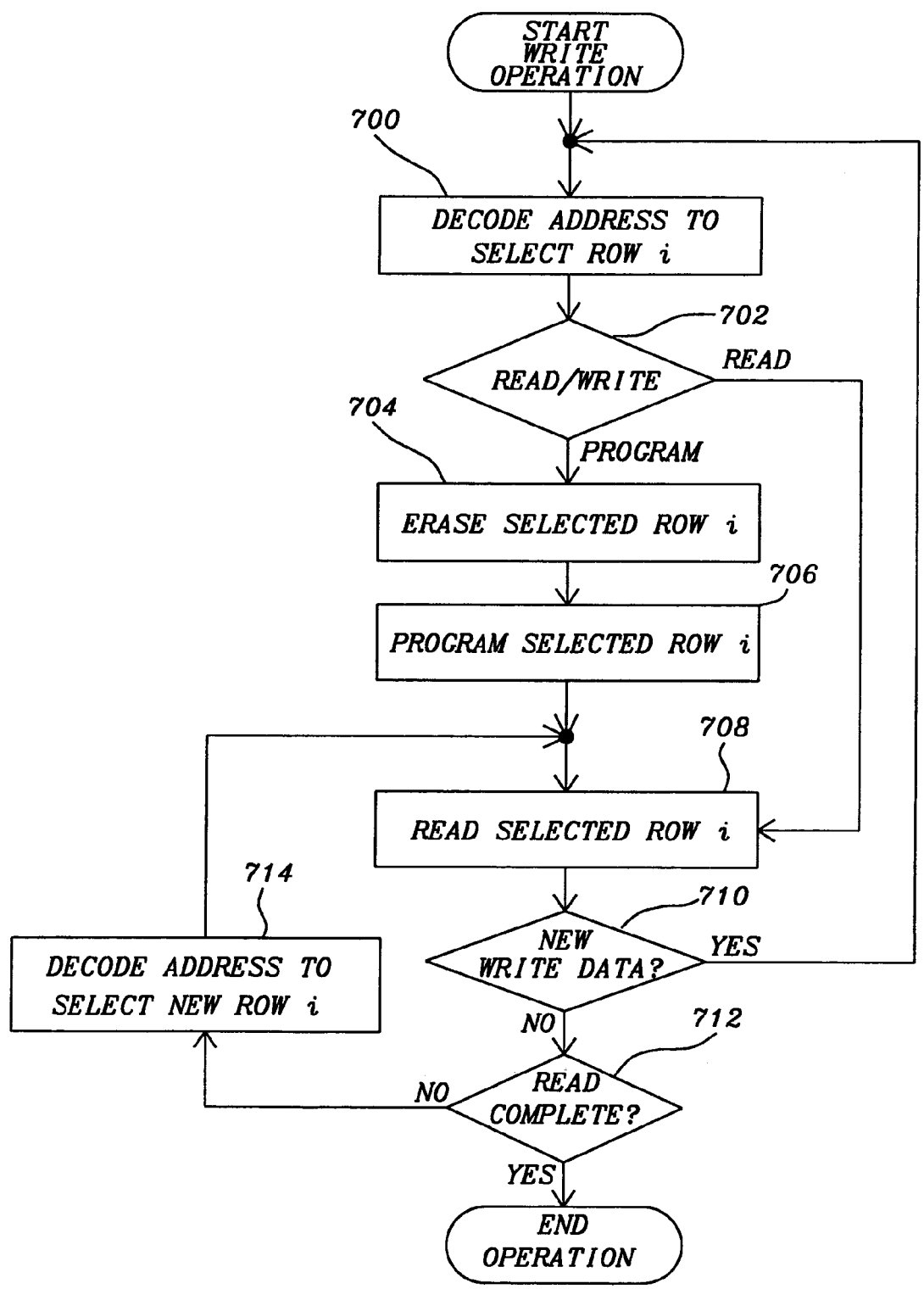
FIG. 11 is a write flow chart of the process for operating an array of dual-sided charge-trapping nonvolatile memory cells of this invention.
Figure 12:
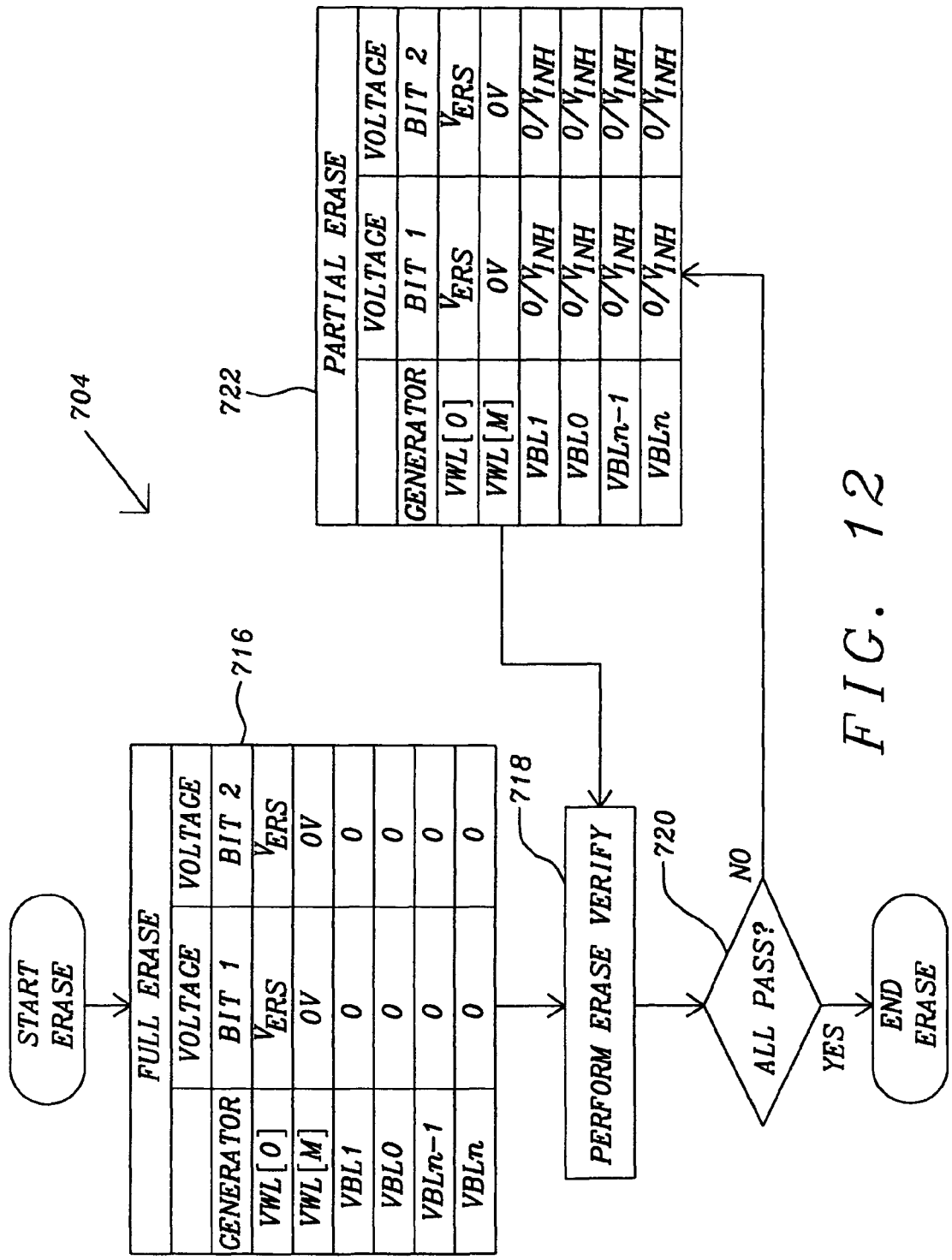
FIG. 12 is flow chart of the process for erasing an NOR array of dual-sided charge-trapping nonvolatile memory cells of this invention.

Refer now to FIG. 11 for an explanation of the method for controlling a read and write operation of a SONOS/MONOS dual-sided charge-trapping nonvolatile memory cell within an array of SONOS/MONOS dual-sided charge-trapping nonvolatile memory cells. As the operation is started, an address is decoded (Box 700) to select the row of the array containing the method for controlling operation of a dual-sided charge-trapping nonvolatile memory cell. The operation is determined (Box 702) to be either a Read or a Write operation. If the operation is a Write, the SONOS/MONOS dual-sided charge-trapping nonvolatile memory cell on the selected row is erased (Box 704). Refer now to FIG. 12 for an explanation of the erase operation (Box 704). A full erase is performed (Box 716) to remove the hot carriers injected during the programming of the SONOS/MONOS dual-sided flash memory cell. The selected word line voltage source (VWL[0]) is set to provide a word line erase voltage level of from approximately +15V to approximately +20V for an n-channel SONOS/MONOS dual-sided flash memory cell. Alternately, if the SONOS/MONOS dual-sided flash memory cell is a p-channel device the word line erase voltage level is from approximately −15V to approximately −20V. It should be noted that the hot carrier charges in the n-channel SONOS/MONOS dual-sided flash memory cell are hot-holes and in the p-channel SONOS/MONOS dual-sided flash memory cell are hot-electrons. The all bit line voltage sources (VBL1, VBL2, VBLn-1 and VBLn) are set to the ground reference voltage level (0V) for a complete erase. The non-selected word line voltage sources (VWL[m]) are set to the ground reference voltage level (0).

Figure 14:
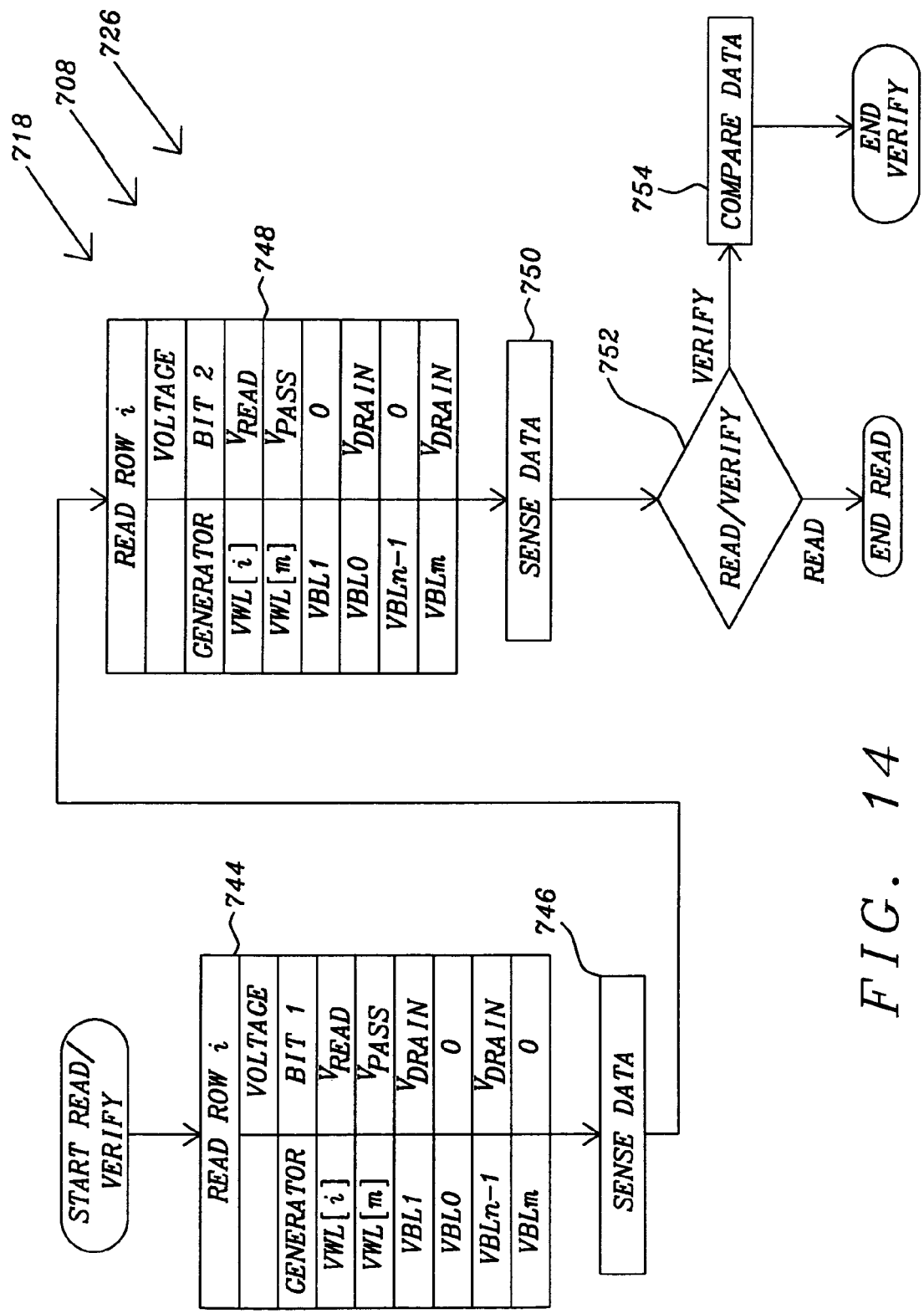
FIG. 14 is flow chart of the process for reading an NOR array of dual-sided charge-trapping nonvolatile memory cells of this invention.

An erase verification step (Box 718) is performed to determine if all the SONOS/MONOS dual-sided charge-trapping nonvolatile memory cells of the selected row are erased. Refer to FIG. 14 for a discussion of the erase verification (Box 718). A read operation (Box 744) of the programmed state of the first charge trapping region is performed. In the read operation of the programmed state of the first charge trapping region of the selected word line voltage source (VWL[0]) is sequentially set to the read voltage level ($V_{READ}$) that is varied incrementally through each of the threshold boundary voltage levels (VPVn) as shown in FIGS. 2b and 2c to determine the program state of the first charge trapping region of the selected SONOS/MONOS dual-sided flash memory cell. The bit lines voltage sources VBL1, VBLn-1 that are connected to the drain associated with the first charge trapping region are set to the drain read voltage ($V_{DRAIN}$) and the bit lines voltage sources VBL2, VBLn that are connected to the source associated with the second charge trapping region are set to the ground reference voltage level. The non-selected word line voltage sources VWL[m] are set to a word line read pass voltage level ($V_{PASS}$). The data of the first charge trapping region of the selected SONOS/MONOS dual-sided charge-trapping nonvolatile memory cell is sensed (Box 746).

A read operation (Box 748) of the programmed state of the second charge trapping region is performed. In the read operation of the programmed state of the second charge trapping region, the selected word line voltage source (VWL[0]) is sequentially set to the read voltage level ($V_{READ}$) that is varied incrementally through each of the threshold boundary voltage levels (VPVn) as shown in FIGS. 2b and 2c to determine the program state of the second charge trapping region of the selected SONOS/MONOS dual-sided flash memory cell. The bit lines voltage sources VBL2, VBLn that are connected to the source associated with the second charge trapping region are set to the drain read voltage ($V_{DRAIN}$) and the bit lines voltage sources VBL1, VBLn-1 that are connected to the drain associated with the first charge trapping region are set to the ground reference voltage level. The non-selected word line voltage sources VWL[m] are set to a word line read pass voltage level ($V_{PASS}$). The data of the first charge trapping region of the selected SONOS/MONOS dual-sided charge-trapping nonvolatile memory cell is sensed (Box 750).

It is then determined (Box 752) if the operation is a Read or a Verify. In the erase verify, the data is compared (Box 754) with the programmed state of an erasure (i.e. (11) of the SONOS/MONOS dual-sided charge-trapping nonvolatile memory cell of FIG. 2b) and the erase verify operation (Box 718) is completed.

Returning to FIG. 12, at the completion of the erase verify operation (Box 718), it is determined (Box 720) if all the SONOS/MONOS dual-sided charge-trapping nonvolatile memory cells of the selected row are erased. If all the SONOS/MONOS dual-sided charge-trapping nonvolatile memory cells are not erased, a partial erase (Box 722) is performed to remove any remaining hot carriers injected during the programming of the SONOS/MONOS dual-sided flash memory cell. The selected word line voltage source (VWL[0]) is set to provide a word line erase voltage level $V_{ERS}$, as described above. For those SONOS/MONOS dual-sided charge-trapping nonvolatile memory cells of the selected row having remaining hot-carrier charges, the bit line voltage sources (VBL1, VBL2, VBLn-1 and VBLn) are set to the ground reference voltage level (0V) to complete the erase. The non-selected word line voltage sources (VWL[m]) are set to the ground reference voltage level (0). Those of the SONOS/MONOS dual-sided charge-trapping nonvolatile memory cells that have been completely erased, the first bit line voltage source and the second bit line voltage source are set to an inhibit voltage level $V_{INH}$ of from approximately +7.5V to approximately +10V.

The erase verify operation (Box 718), as described above, is again performed. If all the SONOS/MONOS dual-sided charge-trapping nonvolatile memory cells of the selected row are not erased the partial erase (Box 722) is performed until all the SONOS/MONOS dual-sided charge-trapping nonvolatile memory cells are erased.

Figure 13A:
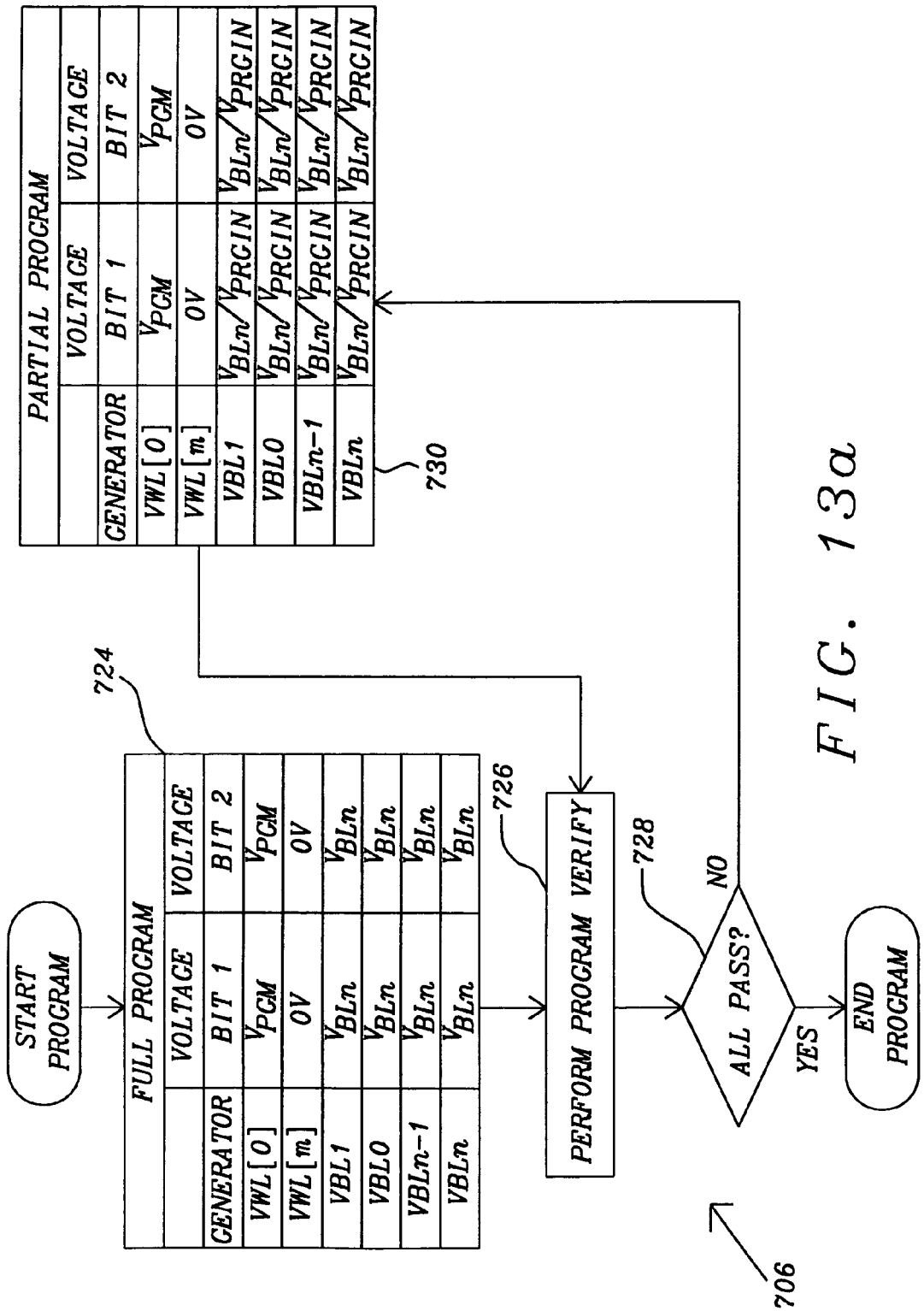
FIG. 13a is flow chart of the process for simultaneous programming an array of dual-sided charge-trapping nonvolatile memory cells of NOR array of this invention.

Returning now to FIG. 11, at the completion of the erase operation (Box 704), the row containing the SONOS/MONOS dual-sided charge-trapping nonvolatile memory cell is now programmed (Box 706). Refer now to FIG. 13a for a discussion of the programming operation (Box 706). The programming operation (Box 706) in this embodiment provides for simultaneous injection of charge into the first and second charge trapping regions. The programming operation (Box 706) begins with a full program operation (Box 724). The word line program voltage level WL[0] is applied to the selected row containing the SONOS/MONOS dual-sided charge-trapping nonvolatile memory cell. The word line program voltage level WL[0] has a voltage level of from approximately −7.0V to approximately −10.0V for an n-channel SONOS/MONOS dual-sided flash memory cell. Alternately, if the SONOS/MONOS dual-sided flash memory cell is a p-channel device the word line voltage level is from approximately +7.0V to approximately +10.0V. It should be noted that the hot carrier charges in the n-channel SONOS/MONOS dual-sided flash memory cell are hot-holes and in the p-channel SONOS/MONOS dual-sided flash memory cell 405 are hot-electrons. The program state of the charge trapping regions of the SONOS/MONOS dual-sided charge-trapping nonvolatile memory cell is determined by the number of hot-carriers injected into each of the first and second charge trapping regions.

To program the first charge trapping region and the second charge trapping region simultaneously, the first bit line voltage source VBL1, . . . , VBLn-1 connected to the drain of each of the SONOS/MONOS dual-sided charge-trapping nonvolatile memory cells of the selected row is set to the bit line voltage level ($V_{BLN}$) that represents the digital data to programmed to the first charge trapping region. The second bit line voltage source VBL2, . . . , VBLn connected to the source of each of the SONOS/MONOS dual-sided charge-trapping nonvolatile memory cells of the selected row is set to the bit line voltage level ($V_{BLN}$) that represents the digital data to be programmed to the second charge trapping region. For example if there are to be two binary digits programmed to each of the first and second charge trapping regions, the first bit line voltage source and the second bit line voltage source are set according to the voltage levels according to Table 1. The word line program voltage levels WL[m] of the non-selected rows of the SONOS/MONOS dual-sided charge-trapping nonvolatile memory cells are set to the ground reference level to prevent any cross programming disturbances.

An program verification step (Box 726) is performed to determine if all the SONOS/MONOS dual-sided charge-trapping nonvolatile memory cells of the selected row are programmed. Refer to FIG. 14 for a discussion of the program verification (Box 726). A read operation (Box 744) of the programmed state of the first charging is performed. In the read operation of the programmed state of the first charge trapping region the selected word line voltage source (VWL[0]) is sequentially set to the read voltage level ($V_{READ}$) that is varied incrementally through each of the threshold boundary voltage levels (VPVn) as shown in FIGS. 2b and 2c to determine the program state of the first charge trapping region of the selected SONOS/MONOS dual-sided flash memory cell. The bit lines voltage sources VBL1, VBLn-1 that are connected to the drain associated with the first charge trapping region are set to the drain read voltage ($V_{DRAIN}$) and the bit lines voltage sources VBL2, VBLn that are connected to the source associated with the second charge trapping region are set to the ground reference voltage level. The non-selected word line voltage sources VWL[m] are set to a word line read pass voltage level ($V_{PASS}$). The data of the first charge trapping region of the selected SONOS/MONOS dual-sided charge-trapping nonvolatile memory cell is sensed (Box 746).

A read operation (Box 748) of the programmed state of the second charging is performed. In the read operation of the programmed state of the second charge trapping region, the selected word line voltage source (VWL[0]) is sequentially set to the read voltage level ($V_{READ}$) that is varied incrementally through each of the threshold boundary voltage levels (VPVn) as shown in FIGS. 2b and 2c to determine the program state of the second charge trapping region of the selected SONOS/MONOS dual-sided flash memory cell. The bit lines voltage sources VBL2, VBLn that are connected to the source associated with the second charge trapping region are set to the drain read voltage ($V_{DRAIN}$) and the bit lines voltage sources VBL1, VBLn-1 that are connected to the drain associated with the first charge trapping region are set to the ground reference voltage level. The non-selected word line voltage sources VWL[m] are set to a word line read pass voltage level ($V_{PASS}$). The data of the first charge trapping region of the selected SONOS/MONOS dual-sided charge-trapping nonvolatile memory cell is sensed (Box 750).

It is then determined (Box 752) if the operation is a Read or a Verify. In the program verify, the data is compared (Box 754) with the desired programmed state of digital data being stored (i.e. the program states of the SONOS/MONOS dual-sided charge-trapping nonvolatile memory cell of FIG. 2b) and the program verify operation (Box 726) is completed.

Returning to FIG. 13a, at the completion of the program verify operation (Box 720), it is determined if all the SONOS/MONOS dual-sided charge-trapping nonvolatile memory cells of the selected row are correctly programmed. If all the SONOS/MONOS dual-sided charge-trapping nonvolatile memory cells are not correctly programmed, a partial program operation (Box 730) is performed to correctly program the first and second charge trapping region. The partial programming operation (Box 730) begins by setting the bit line voltage sources VBL1, . . . , VBLn of the SONOS/MONOS dual-sided charge-trapping nonvolatile memory cells of the selected row that are programmed to a word line program inhibit voltage level ($V_{PRGIN}$). Those of the SONOS/MONOS dual-sided charge-trapping nonvolatile memory cells that were not programmed are now programmed as in the full programming operation (Box 724). Programming the first charge trapping region and the second charge trapping region simultaneously, as described above. The word line program voltage levels WL[m] of the non-selected rows of the SONOS/MONOS dual-sided charge-trapping nonvolatile memory cells are set to the ground reference level to prevent any cross programming disturbances.

The program verify operation (Box 726), as described above, is again performed. If all the SONOS/MONOS dual-sided charge-trapping nonvolatile memory cells of the selected row are not programmed the partial program operation (Box 730) is performed until all the SONOS/MONOS dual-sided charge-trapping nonvolatile memory cells are programmed.

Figure 13B:
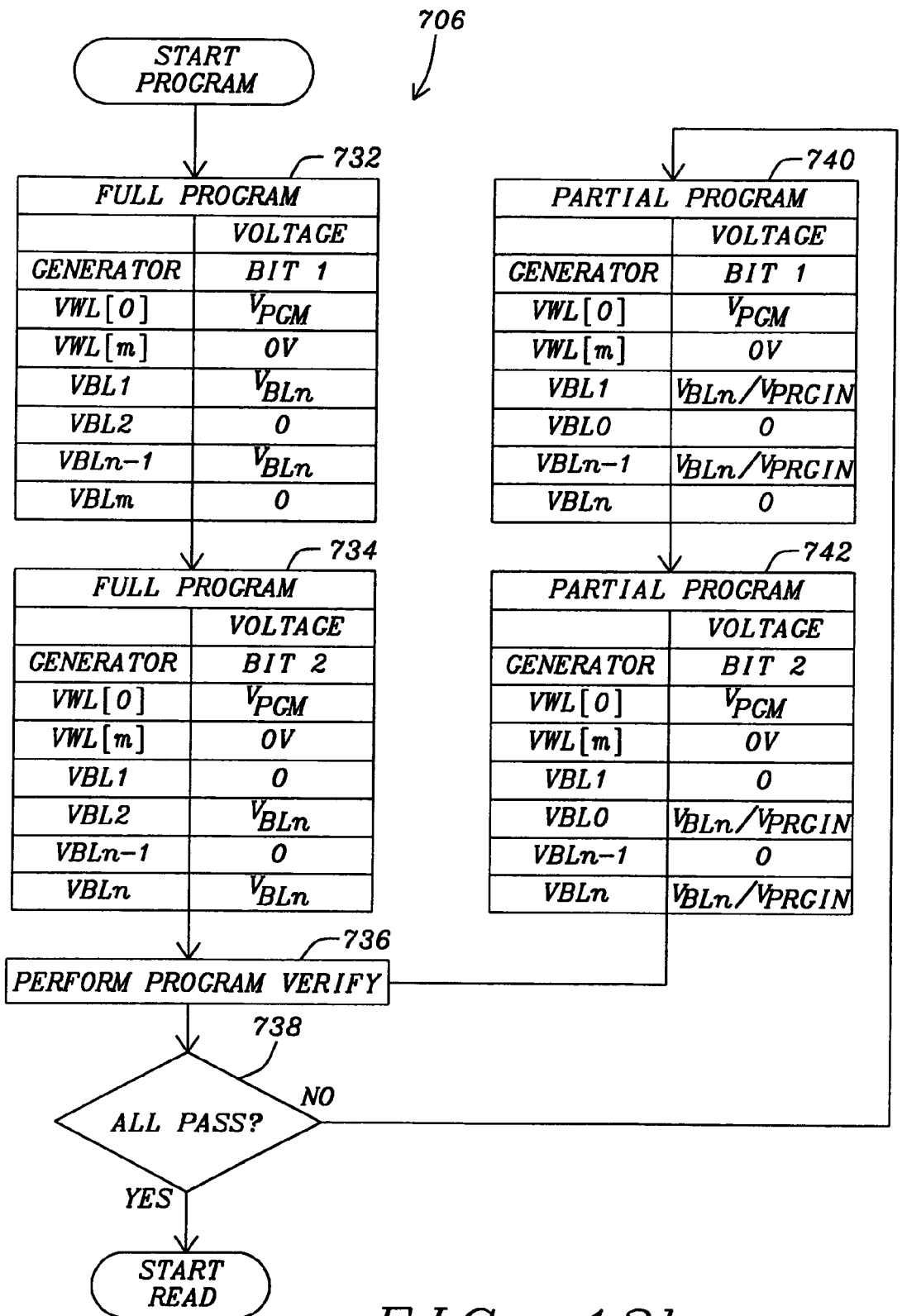
FIG. 13b is flow chart of the process for sequential programming an NOR array of dual-sided charge-trapping nonvolatile memory cells of this invention.

An alternate to the embodiment described in FIG. 13a provides for sequential injection of charges into the first and second charge trapping regions is shown in FIG. 13b. Refer now to FIG. 13b for a discussion of the programming operation (Box 706). The programming operation (Box 706) begins with a full program operation (Box 732) of the first of the charge trapping regions (Bit 1). The word line program voltage level WL[0] is applied to the selected row containing the SONOS/MONOS dual-sided charge-trapping nonvolatile memory cell. The-word line program voltage level WL[0] has a voltage level of from approximately −7.0V to approximately −10.0V for an n-channel SONOS/MONOS dual-sided flash memory cell. Alternately, if the SONOS/MONOS dual-sided flash memory cell is a p-channel device the word line voltage level is from approximately +7.0V to approximately +10.0V. It should be noted that the hot carrier charges in the n-channel SONOS/MONOS dual-sided flash memory cell are hot-holes and in the p-channel SONOS/MONOS dual-sided flash memory cell 405 are hot-electrons. The program state of the charge trapping regions of the SONOS/MONOS dual-sided charge-trapping nonvolatile memory cell is determined by the number of hot-carriers injected into each of the first and second charge trapping regions.

The programming (Box 732) of the first charge trapping region has the first bit line voltage source VBL1, ..., VBLn-1 connected to the drain of each of the SONOS/MONOS dual-sided charge-trapping nonvolatile memory cells of the selected row is set to the bit line voltage level ($V_{BLN}$) that represents the digital data to programmed to the first charge trapping region. The second bit line voltage source VBL2, ..., VBLn connected to the source of each of the SONOS/MONOS dual-sided charge-trapping nonvolatile memory cells of the selected row is set to the ground reference voltage level. For example if there are to be two binary digits programmed to the first charge trapping regions, the first bit line voltage source and the second bit line voltage source are set according to the voltage levels according to Table 2. The word line program voltage levels WL[m] of the non-selected rows of the SONOS/MONOS dual-sided charge-trapping nonvolatile memory cells are set to the ground reference level to prevent any cross programming disturbances.

The programming (Box 732) of the first charge trapping region has the first bit line voltage source VBL1, ..., VBLn-1 connected to the drain of each of the SONOS/MONOS dual-sided charge-trapping nonvolatile memory cells of the selected row is set to the bit line voltage level ($V_{BLN}$) that represents the digital data to programmed to the first charge trapping region. The second bit line voltage source VBL2, ..., VBLn connected to the source of each of the SONOS/MONOS dual-sided charge-trapping nonvolatile memory cells of the selected row is set to the ground reference voltage level. For example if there are to be two binary digits programmed to the first charge trapping regions, the first bit line voltage source and the second bit line voltage source are set according to the voltage levels according to Table 2. The word line program voltage levels WL[m] of the non-selected rows of the SONOS/MONOS dual-sided charge-trapping nonvolatile memory cells are set to the ground reference level to prevent any cross programming disturbances.

The programming (Box 734) of the second charge trapping region has the second bit line voltage source VBL2, ..., VBLn connected to the source of each of the SONOS/MONOS dual-sided charge-trapping nonvolatile memory cells of the selected row is set to the bit line voltage level ($V_{BLN}$) that represents the digital data to programmed to the first charge trapping region. The first bit line voltage source VBL1, ..., VBLn-1 connected to the drain of each of the SONOS/MONOS dual-sided charge-trapping nonvolatile memory cells of the selected row is set to the ground reference voltage level. For example if there are to be two binary digits programmed to the second charge trapping regions, the first bit line voltage source and the second bit line voltage source are set according to the voltage levels according to Table 3. The word line program voltage levels WL[m] of the non-selected rows of the SONOS/MONOS dual-sided charge-trapping nonvolatile memory cells are set to the ground reference level to prevent any cross programming disturbances.

A program verification step (Box 736) to determine if all the SONOS/MONOS dual-sided charge-trapping nonvolatile memory cells of the selected row are programmed, as described above, is again performed.

At the completion of the program verify operation (Box 736), it is determined (Box 738) if all the SONOS/MONOS dual-sided charge-trapping nonvolatile memory cells of the selected row are correctly programmed. If all the SONOS/MONOS dual-sided charge-trapping nonvolatile memory cells are not correctly programmed, a partial program operation (Box 740) is performed to correctly program the first charge trapping region. The partial programming operation of the first charge trapping region (Box 740) begins by setting the bit line voltage sources VBL1, ..., VBLn of the SONOS/MONOS dual-sided charge-trapping nonvolatile memory cells of the selected row that are programmed to a word line program inhibit voltage level (VPRGIN). Those of the SONOS/MONOS dual-sided charge-trapping nonvolatile memory cells that were not programmed are now programmed as in the full programming operation (Boxes 732 and 734). Programming the first charge trapping region is as described above. The word line program voltage levels WL[m] of the non-selected rows of the SONOS/MONOS dual-sided charge-trapping nonvolatile memory cells are set to the ground reference level to prevent any cross programming disturbances.

The program verify operation (Box 726), as described above, is again performed. If all the SONOS/MONOS dual-sided charge-trapping nonvolatile memory cells of the selected row are not programmed, the partial program operations (Boxes 740 and 742) are performed until all the SONOS/MONOS dual-sided charge-trapping nonvolatile memory cells are programmed.

It should be noted that the order of the full programming (Boxes 732 and 734) and the partial programming (Boxes 740 and 742) may be reversed such that the second charge trapping region maybe programmed before the first charge trapping region. This permits flexibility in the assignment of the addressing to the locations of the first and second charge trapping regions.

Returning now to FIG. 11, at the completion of the program operation (Box 706), the selected row is now read (Box 708). Refer to FIG. 14 for a discussion of the read operation (Box 708). A read operation (Box 744) of the programmed state of the first charging is performed. In the read operation of the programmed state of the first charge trapping region the selected word line voltage source (VWL[0]) is sequentially set to the read voltage level ($V_{READ}$) that is varied incrementally through each of the threshold boundary voltage levels (VPVn) as shown in FIGS. 2b and 2c to determine the program state of the first charge trapping region of the selected SONOS/MONOS dual-sided flash memory cell. The bit lines voltage sources VBL1, VBLn-1 that are connected to the drain associated with the first charge trapping region are set to the drain read voltage ($V_{DRAIN}$) and the bit lines voltage sources VBL2, VBLn that are connected to the source associated with the second charge trapping region are set to the ground reference voltage level. The non-selected word line voltage sources VWL[m] are set to a word line read pass voltage level ($V_{PASS}$). The data of the first charge trapping region of the selected SONOS/MONOS dual-sided charge-trapping nonvolatile memory cell is sensed (Box 746).

A read operation (Box 748) of the programmed state of the second charging is performed. In the read operation of the programmed state of the second charge trapping region, the selected word line voltage source (VWL[0]) is sequentially set to the read voltage level ($V_{READ}$) that is varied incrementally through each of the threshold boundary voltage levels (VPVn) as shown in FIGS. 2b and 2c to determine the program state of the second charge trapping region of the selected SONOS/MONOS dual-sided flash memory cell. The bit lines voltage sources VBL2, VBLn that are connected to the source associated with the second charge trapping region are set to the drain read voltage ($V_{DRAIN}$) and the bit lines voltage sources VBL1, VBLn-1 that are connected to the drain associated with the first charge trapping region are set to the ground reference voltage level. The non-selected word line voltage sources VWL[m] are set to a word line read pass voltage level ($V_{PASS}$). The data of the first charge trapping region of the selected SONOS/MONOS dual-sided charge-trapping nonvolatile memory cell is sensed (Box 750). It is then determined (Box 752) if the operation is a Read or a Verify. If the operation is a Read, the operation is completed.

A write command is examined (Box 710) to determine if new program data is to be stored to the SONOS/MONOS dual-sided charge-trapping nonvolatile memory cell of the selected row. If new write data is available, the address for the row is decoded and the row selected (Box 700). The write operation is determined (Box 702) and the selected row is erased (Box 704). The selected row is programmed (Box 706). The row is read (Box 708).

If there is no new write data, the read command is examined (Box 712) to determine if the read operation is completed. If the read is not completed, a new address is decoded (Box 714) and the selected row is read (Box 708). If the read operation is complete, the operation of the SONOS/MONOS dual-sided charge-trapping nonvolatile memory cell is ended.

The array structure of FIG. 7 is exemplary showing essentially a single transistor NOR flash SONOS/MONOS dual-sided charge-trapping nonvolatile memory cell array. The array may be configured as NAND configured array, one, two, or three transistor NOR configured array, EEPROM configured array and the combination SONOS/MONOS dual-sided charge-trapping nonvolatile memory cell arrays. The support structure for each configuration is modified to provide the program, erase, and read operations as described above.

While this invention has been particularly shown and described with reference to the preferred embodiments thereof, it will be understood by those skilled in the art that various changes in form and details may be made without departing from the spirit and scope of the invention.

The invention claimed is:

1. A control apparatus for operation of a dual-sided charge-trapping nonvolatile memory cell for programming, reading, and erasing trapped charges representing multiple digital data bits within a charge trapping region of said dual-sided charge-trapping nonvolatile memory cell, said control apparatus comprising:
a programming circuit comprising:
a word line program voltage source that provides a negative medium large program voltage for generating a voltage field between a control gate of said dual-sided charge-trapping nonvolatile memory cell and a channel region of said dual-sided charge-trapping nonvolatile memory cell to extracted hot carriers from said channel region to be injected into a first and second charge trapping region of said dual-sided charge-trapping nonvolatile memory cell;
a first bit line program voltage source that provides one of a plurality of threshold adjustment voltages representing a portion of said multiple digital data bits to a first drain/source of said dual-sided charge-trapping nonvolatile memory cell to set a first level of said hot carrier charge representing said portion of said multiple digital data bits to said first charge trapping region; and
a second bit line program voltage source that provides a second of said plurality of threshold adjustment voltages representing another portion of said multiple digital data bits to a second drain/source of said dual-sided charge-trapping nonvolatile memory cell to set a second level of said hot carrier charge representing said portion of said multiple digital data bits to said second charge trapping region;
wherein the first bit line program voltage source provides said one of said plurality of threshold adjustment voltages to said first drain/source of said dual-sided charge-trapping nonvolatile memory cell and said second bit line program voltage source to a ground reference voltage level to program said first drain/source to inject charge to said first charge trapping region; and
wherein prior to injecting charge to said first charge trapping region, the second bit line program voltage source provides said second of said plurality of threshold adjustment voltages to said second drain/source of said dual-sided charge-trapping nonvolatile memory cell and said first bit line program voltage source to a ground reference voltage level to program said first drain/source to inject charge to said second charge trapping region.

2. The control apparatus for operation of a dual-sided charge-trapping nonvolatile memory cell of claim 1 wherein subsequent to injecting charge to said first charge trapping region, the second bit line program voltage source provides said second of said plurality of threshold adjustment voltages to said second drain/source of said dual-sided charge-trapping nonvolatile memory cell and said first bit line program voltage source to a ground reference voltage level to program said first drain/source to inject charge to said second charge trapping region.

3. The control apparatus for operation of a dual-sided charge-trapping nonvolatile memory cell of claim 1 wherein said first bit line program voltage source provides said one of said plurality of threshold adjustment voltages to said first drain/source of said dual-sided charge-trapping nonvolatile memory cell and said second bit line program voltage source simultaneously provides said second of said plurality of threshold adjustment voltages to said second drain/source of said to concurrently inject charge to said first charge trapping region and said second charge trapping region.

4. The control apparatus for operation of a dual-sided charge-trapping nonvolatile memory cell of claim 1 further comprising:
a read/verify circuit comprising:
a word line read voltage source that generates one of a plurality of threshold detection voltages to detect one of a plurality of programmed threshold voltages of said dual-sided charge-trapping nonvolatile memory cell resulting from a selected one of said plurality of threshold adjustment voltages representative of said portion of multiple digital data bits;
a read drain voltage generator that generates a drain voltage level that is transferred to first drain/source and the second drain/source to activate said dual-sided charge-trapping nonvolatile memory cell dependent upon a trapped charge level within said charge trapping region; and
a first ground reference voltage generator to generate a ground reference voltage transferred to said first and second drain/sources; and
a sensing circuit which detects a programmed state of said charge trapping region representing said multiple digital data bits.

5. The control apparatus for operation of a dual-sided charge-trapping nonvolatile memory cell of claim 4 further comprising:
an erasing apparatus for extracting said hot carrier charges from said charge trapping region, comprising
a word line erase voltage source that provides a very large positive erase voltage for generating a voltage field between said channel region of said dual-sided charge-trapping nonvolatile memory cell and said control gate of said dual-sided charge-trapping nonvolatile memory cell to extract hot carriers from said charge trapping region to be injected into channel region of said dual-sided charge-trapping nonvolatile memory cell; and
a second ground reference voltage generator to apply said ground reference voltage to said first and second drain/sources.

6. The control apparatus for operation of a dual-sided charge-trapping nonvolatile memory cell of claim 4 wherein said dual-sided charge-trapping nonvolatile memory cell is an n-channel memory cell.

7. The control apparatus for operation of a dual-sided charge-trapping nonvolatile memory cell of claim 6 wherein said very large program voltage has a level of from approximately −6.0V to approximately −10.0V to cause said hot carrier injection to be a hot hole injection to said charge trapping layer.

8. The control apparatus for operation of a dual-sided charge-trapping nonvolatile memory cell of claim 6 wherein said plurality of threshold adjustment voltages have a voltage range of from approximately +1.0V to approximately +6.0V divided into intervals sufficient to determine said first and second portion of said plurality of said multiple digital data bits.

9. The control apparatus for operation of a dual-sided charge-trapping nonvolatile memory cell of claim 6 wherein said plurality of threshold detection voltages have a voltage range from approximately +2.0V to approximately +5.0V and are divided into increments that differentiate said plurality of programmed threshold voltages.

10. The control apparatus for operation of a dual-sided charge-trapping nonvolatile memory cell of claim 6 wherein said drain voltage level must be a voltage level sufficient to overcome threshold voltages of said first and second drain sources and not sufficient to cause soft writing of said dual-sided charge-trapping nonvolatile memory cell.

11. The control apparatus for operation of a dual-sided charge-trapping nonvolatile memory cell of claim 5 wherein said very large erase voltage has voltage level of from approximately +15.0V to approximately +20V to increase said threshold voltage of said dual-sided charge-trapping nonvolatile memory cell.

12. The control apparatus for operation of a dual-sided charge-trapping nonvolatile memory cell of claim 5 wherein said dual-sided charge-trapping nonvolatile memory cell is a p-channel memory cell.

13. The control apparatus for operation of a dual-sided charge-trapping nonvolatile memory cell of claim 12 wherein said very large program voltage has a level of from approximately +6.0V to approximately +10.0V to cause said hot carrier injection to be a hot hole injection to said charge trapping layer.

14. The control apparatus for operation of a dual-sided charge-trapping nonvolatile memory cell of claim 12 wherein said plurality of threshold adjustment voltages have a voltage range of from approximately −1.0V to approximately −6.0V divided into intervals sufficient to determine said first and second portion of said plurality of said multiple digital data bits.

15. The control apparatus for operation of a dual-sided charge-trapping nonvolatile memory cell of claim 12 wherein said plurality of threshold detection voltages have a voltage range from approximately −2.0V to approximately −5.0V and are divided into increments that differentiate said plurality of programmed threshold voltages.

16. The control apparatus for operation of a dual-sided charge-trapping nonvolatile memory cell of claim 12 wherein said drain voltage level must be a voltage level sufficient to overcome threshold voltages of said first and second drain sources and not sufficient to cause soft writing of said dual-sided charge-trapping nonvolatile memory cell.

17. The control apparatus for operation of a dual-sided charge-trapping nonvolatile memory cell of claim 12 wherein said very large erase voltage has voltage level of from approximately −15.0V to approximately −20V to decrease said threshold voltage of said dual-sided charge-trapping nonvolatile memory cell.

18. A nonvolatile memory integrated circuit comprising:
an array of a plurality dual-sided charge-trapping nonvolatile memory cells arranged in rows and columns;
a plurality of word lines, each word line connected to control gates of all said dual-sided charge-trapping nonvolatile memory cells of one of said rows of said array of said plurality dual-sided charge-trapping nonvolatile memory cells;
a plurality of bit lines, each bit line in communication with one drain/source of all said dual-sided charge-trapping nonvolatile memory cells of one of said columns of said array of said plurality dual-sided charge-trapping nonvolatile memory cells; and
a control apparatus for operation of the plurality of the dual-sided charge-trapping nonvolatile memory cell for programming, reading, and erasing trapped charges representing multiple digital data bits within a first and second charge trapping region of each of said dual-sided charge-trapping nonvolatile memory cells, said control apparatus comprising:

a programming circuit comprising:
- a word line program voltage source that provides a very large program voltage for generating a voltage field between a control gate of selected dual-sided charge-trapping nonvolatile memory cells and a channel region of said selected dual-sided charge-trapping nonvolatile memory cells to extract hot carriers from said channel region to be injected into a charge trapping region of said selected dual-sided charge-trapping nonvolatile memory cells;
- a first bit line program voltage source that provides one of a plurality of threshold adjustment voltages representing a portion of said multiple digital data bits to a first drain/source of said selected dual-sided charge-trapping nonvolatile memory cells to set a first level of said hot carrier charge representing said portion of said multiple digital data bits to said first charge trapping region; and
- a second bit line program voltage source that provides a second of said plurality of threshold adjustment voltages representing another portion of said multiple digital data bits to a second drain/source of said selected dual-sided charge-trapping nonvolatile memory cells to set a second level of said hot carrier charge representing said portion of said multiple digital data bits to said second charge trapping region;
- wherein the first bit line program voltage source provides said one of said plurality of threshold adjustment voltages to said first drain/source of said selected dual-sided charge-trapping nonvolatile memory cells and said second bit line program voltage source to a ground reference voltage level to program said first drain/source to inject charge to said first charge trapping region; and
- wherein prior to injecting charge to said first charge trapping region, the second bit line program voltage source provides said second of said plurality of threshold adjustment voltages to said second drain/source of said selected dual-sided charge-trapping nonvolatile memory cells and said first bit line program voltage source to a ground reference voltage level to program said first drain/source to inject charge to said second charge trapping region.

19. The nonvolatile memory integrated circuit of claim 18 wherein subsequent to injecting charge to said first charge trapping region, the second bit line program voltage source provides said second of said plurality of threshold adjustment voltages to said second drain/source of said selected dual-sided charge-trapping nonvolatile memory cells and said first bit line program voltage source to a ground reference voltage level to program said first drain/source to inject charge to said second charge trapping region.

20. The nonvolatile memory integrated circuit of claim 19 wherein said first bit line program voltage source provides said one of said plurality of threshold adjustment voltages to said first drain/source of said selected dual-sided charge-trapping nonvolatile memory cells and said second bit line program voltage source simultaneously provides said second of said plurality of threshold adjustment voltages to said second drain/source of said selected dual-sided charge-trapping nonvolatile memory cells to concurrently inject charge to said first charge trapping region and said second charge trapping region.

21. The nonvolatile memory integrated circuit of claim 18 wherein said control apparatus further comprises:

an read/verify apparatus comprising:
- a word line read voltage source that generates one of a plurality of threshold detection voltages to detect one of a plurality of programmed threshold voltages of said dual-sided charge-trapping nonvolatile memory cell resulting from a selected one of said plurality of threshold adjustment voltages representative of said portion of multiple digital data bits;
- a read drain voltage generator that generates a drain voltage level that is transferred to first drain/source and the second drain/source to activate said dual-sided charge-trapping nonvolatile memory cell dependent upon a trapped charge level within said charge trapping region; and
- a first ground reference voltage generator to generate a ground reference voltage transferred to said first and second drain/sources; and
- a sensing circuit which detects a programmed state of said charge trapping region representing said multiple digital data bits.

22. The nonvolatile memory integrated circuit of claim 21 wherein said control apparatus further comprises:

an erasing circuit for extracting said hot carrier charges from said charge trapping region, comprising
- a word line erase voltage source that provides a very large erase voltage for generating a voltage field between said channel region of said dual-sided charge-trapping nonvolatile memory cell and said control gate of said dual-sided charge-trapping nonvolatile memory cell to extracted hot carriers from said charge trapping region to be injected into channel region of said dual-sided charge-trapping nonvolatile memory cell; and
- a second ground reference voltage generator to apply said ground reference voltage to said first and second drain/sources.

23. The nonvolatile memory integrated circuit of claim 22 wherein each of said plurality dual-sided charge-trapping nonvolatile memory cells is an n-channel memory cell.

24. The nonvolatile memory integrated circuit of claim 23 wherein said very large program voltage has a level of from approximately −6.0V to approximately −10.0V to cause said hot carrier injection to be a hot hole injection to said charge trapping layer.

25. The nonvolatile memory integrated circuit of claim 23 wherein said plurality of threshold adjustment voltages have a voltage range of from approximately +2.0V to approximately +6.0V divided into intervals sufficient to determine said first and second portion of said plurality of said multiple digital data bits.

26. The nonvolatile memory integrated circuit of claim 23 wherein said plurality of threshold detection voltages have a voltage range from approximately +2.0V to approximately +5.0V and are divided into increments that differentiate said plurality of programmed threshold voltages.

27. The nonvolatile memory integrated circuit of claim 23 wherein said drain voltage level must be a voltage level sufficient to overcome threshold voltages of said first and second drain sources and not sufficient to cause soft writing of said dual-sided charge-trapping nonvolatile memory cell.

28. The nonvolatile memory integrated circuit of claim 23 wherein said very large erase voltage has voltage level of from approximately +15.0V to approximately +20V to increase said threshold voltage of said dual-sided charge-trapping nonvolatile memory cell.

29. The nonvolatile memory integrated circuit of claim 22 wherein each of said plurality dual-sided charge-trapping nonvolatile memory cells is a p-channel memory cell.

30. The nonvolatile memory integrated circuit of claim 29 wherein said very large program voltage has a level of from approximately +6.0V to approximately +10.0V to cause said hot carrier injection to be a hot hole injection to said charge trapping layer.

31. The nonvolatile memory integrated circuit of claim 29 wherein said plurality of threshold adjustment voltages have a voltage range of from approximately −2.0V to approximately −6.0V divided into intervals sufficient to determine said first and second portion of said plurality of said multiple digital data bits.

32. The nonvolatile memory integrated circuit of claim 29 wherein said plurality of threshold detection voltages have a voltage range from approximately −2.0V to approximately −5.0V and are divided into increments that differentiate said plurality of programmed threshold voltages.

33. The nonvolatile memory integrated circuit of claim 29 wherein said drain voltage level must be a voltage level sufficient to overcome threshold voltages of said first and second drain sources and not sufficient to cause soft writing of said dual-sided charge-trapping nonvolatile memory cell.

34. The nonvolatile memory integrated circuit of claim 29 wherein said very large erase voltage has voltage level of from approximately −15.0V to approximately −20V to decrease said threshold voltage of said dual-sided charge-trapping nonvolatile memory cell.

35. A method for controlling operation of a dual-sided charge-trapping nonvolatile memory cell for programming, reading, and erasing trapped charges representing multiple digital data bits within two charge trapping regions of said dual-sided charge-trapping nonvolatile memory cell, said method for controlling operation of a dual-sided charge-trapping nonvolatile memory cell comprising the steps of:
programming said dual-sided charge-trapping nonvolatile memory cell by the steps of:
providing a very large program voltage for generating a voltage field between a control gate of said dual-sided charge-trapping nonvolatile memory cell and a channel region of said dual-sided charge-trapping nonvolatile memory cell to extracted hot carriers from said channel region to be injected into a charge trapping region of said dual-sided charge-trapping nonvolatile memory cell;
providing one of a first plurality of threshold adjustment voltages representing a portion of said multiple digital data bits to a first drain/source of said dual-sided charge-trapping nonvolatile memory cell to set a first level of said hot carrier charge representing said portion of said multiple digital data bits to one of said charge trapping regions;
providing a second of said plurality of threshold adjustment voltages representing another portion of said multiple digital data bits to a second drain/source of said dual-sided charge-trapping nonvolatile memory cell to set a second level of said hot carrier charge representing said portion of said multiple digital data bits to another of said charge trapping regions;
providing said one of said plurality of threshold adjustment voltages to said first drain/source of said nonvolatile memory cell array;
providing a ground reference voltage level to said second source/drain to inject charge to said first charge trapping region; and
prior to injecting charge to said first charge trapping region, providing by the second bit line program voltage source said second of said plurality of threshold adjustment voltages to said second drain/source of said dual-sided charge-trapping nonvolatile memory cell and connecting said first bit line program voltage source to a ground reference voltage level to program said first drain/source to inject charge to said second charge trapping region.

36. The method of claim 35 further comprising the steps of:
subsequent to injecting charge to said first charge trapping region, providing said second of said plurality of threshold adjustment voltages to said second drain/source of said nonvolatile memory cell array; and
providing a ground reference voltage level to program said first drain/source to inject charge to said second charge trapping region.

37. The method of claim 35 further comprising the steps of:
providing said one of said plurality of threshold adjustment voltages to said first drain/source of said nonvolatile memory cell array; and
simultaneously providing said second of said plurality of threshold adjustment voltages to said second drain/source of said dual-sided charge-trapping nonvolatile memory cell to concurrently inject charge to said first charge trapping region and said second charge trapping region.

38. The method for controlling operation of a dual-sided charge-trapping nonvolatile memory cell of claim 35 further comprising the steps of:
reading said multiple digital data bits from said dual-sided charge-trapping nonvolatile memory cell by the steps of:
generating one of a plurality of threshold detection voltages to detect one of a plurality of programmed threshold voltages of said dual-sided charge-trapping nonvolatile memory cell resulting from a selected one of said plurality of threshold adjustment voltages representative of said portion of multiple digital data bits;
generating a drain voltage level that is transferred to first drain/source and the second drain/source to activate said dual-sided charge-trapping nonvolatile memory cell dependent upon a trapped charge level within said charge trapping region; and
generating a ground reference voltage transferred to said first and second drain/sources; and
detecting a programmed state of said charge trapping region representing said multiple digital data bits.

39. The method for controlling operation of a dual-sided charge-trapping nonvolatile memory cell of claim 38 further comprising the steps of:
erasing said dual-sided charge-trapping nonvolatile memory cell by extracting said hot carrier charges from said charge trapping region, comprising the steps of:
providing a very large erase voltage for generating a voltage field between said channel region of said dual-sided charge-trapping nonvolatile memory cell and said control gate of said dual-sided charge-trapping nonvolatile memory cell to extract hot carriers from said charge trapping region to be injected into channel region of said dual-sided charge-trapping nonvolatile memory cell; and
applying said ground reference voltage to said first and second drain/sources.

40. The method for controlling operation of a dual-sided charge-trapping nonvolatile memory cell of claim 39 wherein said dual-sided charge-trapping nonvolatile memory cell is an n-channel memory cell.

41. The method for controlling operation of a dual-sided charge-trapping nonvolatile memory cell of claim 40 wherein said very large program voltage has a level of from approximately −6.0V to approximately −10.0V to cause said hot carrier injection to be a hot hole injection to said charge trapping layer.

42. The method for controlling operation of a dual-sided charge-trapping nonvolatile memory cell of claim 40 wherein said plurality of threshold adjustment voltages have a voltage range of from approximately +1.0V to approximately +6.0V divided into intervals sufficient to determine said first and second portion of said plurality of said multiple digital data bits.

43. The method for controlling operation of a dual-sided charge-trapping nonvolatile memory cell of claim 40 wherein said plurality of threshold detection voltages have a voltage range from approximately +2.0V to approximately +5.0V and are divided into increments that differentiate said plurality of programmed threshold voltages.

44. The method for controlling operation of a dual-sided charge-trapping nonvolatile memory cell of claim 40 wherein said drain voltage level must be a voltage level sufficient to overcome threshold voltages of said first and second drain sources and not sufficient to cause soft writing of said dual-sided charge-trapping nonvolatile memory cell.

45. The method for controlling operation of a dual-sided charge-trapping nonvolatile memory cell of claim 40 wherein said very large erase voltage has voltage level of from approximately +15.0V to approximately +20V to increase said threshold voltage of said dual-sided charge-trapping nonvolatile memory cell.

46. The method for controlling operation of a dual-sided charge-trapping nonvolatile memory cell of claim 35 wherein said dual-sided charge-trapping nonvolatile memory cell is a p-channel memory cell.

47. The method for controlling operation of a dual-sided charge-trapping nonvolatile memory cell of claim 46 wherein said very large program voltage has a level of from approximately +6.0V to approximately +10.0V to cause said hot carrier injection to be a hot hole injection to said charge trapping layer.

48. The method for controlling operation of a dual-sided charge-trapping nonvolatile memory cell of claim 46 wherein said plurality of threshold adjustment voltages have a voltage range of from approximately −1.0V to approximately −6.0V divided into intervals sufficient to determine said first and second portion of said plurality of said multiple digital data bits.

49. The method for controlling operation of a dual-sided charge-trapping nonvolatile memory cell of claim 46 wherein said plurality of threshold detection voltages have a voltage range from approximately −2.0V to approximately −5.0V and are divided into increments that differentiate said plurality of programmed threshold voltages.

50. The method for controlling operation of a dual-sided charge-trapping nonvolatile memory cell of claim 46 wherein said drain voltage level must be a voltage level sufficient to overcome threshold voltages of said first and second drain sources and not sufficient to cause soft writing of said dual-sided charge-trapping nonvolatile memory cell.

51. The method for controlling operation of a dual-sided charge-trapping nonvolatile memory cell of claim 46 wherein said very large erase voltage has voltage level of from approximately −15.0V to approximately −20V to decrease said threshold voltage of said dual-sided charge-trapping nonvolatile memory cell.

* * * * *